(12) United States Patent
Tran et al.

(10) Patent No.: US 12,046,290 B2
(45) Date of Patent: Jul. 23, 2024

(54) VERIFYING OR READING A CELL IN AN ANALOG NEURAL MEMORY IN A DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Vipin Tiwari, Dublin, CA (US); Nhan Do, Saratoga, CA (US); Mark Reiten, Alamo, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 746 days.

(21) Appl. No.: 17/125,459

(22) Filed: Dec. 17, 2020

(65) Prior Publication Data

US 2021/0142854 A1    May 13, 2021

Related U.S. Application Data

(62) Division of application No. 15/990,395, filed on May 25, 2018, now Pat. No. 10,910,061.

(60) Provisional application No. 62/642,878, filed on Mar. 14, 2018.

(51) Int. Cl.
*G11C 16/10* (2006.01)
*G06N 3/065* (2023.01)
*G11C 16/16* (2006.01)

(52) U.S. Cl.
CPC ........... *G11C 16/107* (2013.01); *G06N 3/065* (2023.01); *G11C 16/16* (2013.01)

(58) Field of Classification Search
CPC ....... G11C 16/107; G11C 16/16; G06N 3/065
See application file for complete search history.

(56) References Cited

U.S. PATENT DOCUMENTS

| | | | |
|---|---|---|---|
| 5,684,747 | A | 11/1997 | Urai |
| 6,153,494 | A | 11/2000 | Hsieh |
| 6,724,029 | B2 | 4/2004 | Hsu et al. |
| 6,724,036 | B1 | 4/2004 | Hsieh et al. |
| 7,002,843 | B2 | 2/2006 | Guterman et al. |

(Continued)

FOREIGN PATENT DOCUMENTS

| | | |
|---|---|---|
| CN | 107665126 A | 2/2018 |
| JP | S62-140298 A | 6/1987 |

(Continued)

OTHER PUBLICATIONS

Japanese Decision to Grant dated Dec. 27, 2022 for the related counterpart Japanese Patent Application No. 2020-548820. (see attached English translations).

(Continued)

*Primary Examiner* — David E Choi
(74) *Attorney, Agent, or Firm* — DLA PIPER LLP US

(57) ABSTRACT

Numerous embodiments of programming, verifying, and reading systems and methods for use with a vector-by-matrix multiplication (VMM) array in an artificial neural network are disclosed. Selected cells can be programmed and verified with extreme precision to hold one of N different values. During a read operation, the system determines which of the N different values is stored in a selected cell.

12 Claims, 37 Drawing Sheets

(56) References Cited

U.S. PATENT DOCUMENTS

| | | |
|---|---|---|
| 7,417,900 B2 | 8/2008 | Roland et al. |
| 7,466,575 B2 | 12/2008 | Shalvi |
| 7,474,559 B1 | 1/2009 | Lakkapragada et al. |
| 7,848,158 B2 | 12/2010 | Moschiano et al. |
| 8,315,093 B2 | 11/2012 | Dong |
| 9,165,629 B2 | 10/2015 | Chih |
| 9,384,845 B2 | 7/2016 | Yang et al. |
| 9,484,097 B2 | 11/2016 | Kim |
| 2003/0063518 A1 | 4/2003 | Fong et al. |
| 2005/0128989 A1 | 6/2005 | Bhagwat et al. |
| 2006/0067121 A1 | 3/2006 | Guterman |
| 2006/0291285 A1* | 12/2006 | Mokhlesi ............ G11C 16/3468 365/185.18 |
| 2007/0077705 A1 | 4/2007 | Prinz et al. |
| 2008/0198652 A1 | 8/2008 | Shalvi |
| 2009/0052255 A1 | 2/2009 | Moon |
| 2012/0008372 A1 | 1/2012 | Toda |
| 2014/0036596 A1 | 2/2014 | Chan |
| 2014/0056058 A1 | 2/2014 | Jefremow et al. |
| 2015/0286239 A1* | 10/2015 | Regier ...................... G05F 3/16 323/313 |
| 2016/0125937 A1 | 5/2016 | Kang |
| 2016/0141041 A1 | 5/2016 | Yang et al. |
| 2016/0225441 A1 | 8/2016 | Toda |
| 2016/0267958 A1 | 9/2016 | Debrosse |
| 2016/0293260 A1 | 10/2016 | Tran et al. |
| 2017/0243642 A1 | 8/2017 | Muralimanohar |
| 2017/0300378 A1* | 10/2017 | Huang .................... G11C 16/32 |
| 2017/0337466 A1 | 11/2017 | Bayat et al. |
| 2017/0358352 A1 | 12/2017 | Ge |
| 2018/0102157 A1* | 4/2018 | Bedeschi ............ G11C 11/2293 |

FOREIGN PATENT DOCUMENTS

| | | |
|---|---|---|
| JP | H08-297983 | 11/1996 |
| JP | H10-134587 | 5/1998 |
| JP | 2000-353393 | 12/2000 |
| JP | 2007-128625 | 5/2007 |
| JP | 2007-520029 | 7/2007 |
| JP | 2008-293619 A | 12/2008 |
| JP | 2011-527069 | 10/2011 |
| JP | 2016-513330 | 5/2016 |
| JP | 2019-517138 | 6/2019 |
| KR | 10-2016-0129071 A | 11/2016 |
| TW | I 601066 B | 10/2017 |
| TW | 201742069 | 12/2017 |
| WO | 03025944 A1 | 3/2003 |
| WO | 2017/200710 | 11/2017 |
| WO | 2017/200883 | 11/2017 |
| WO | 2019/212699 A1 | 11/2019 |

OTHER PUBLICATIONS

European Search Report dated Nov. 30, 2021 for the counterpart European Patent Application No. 19767102.7.
S. Korean Office Action mailed on Dec. 23, 2022 corresponding to the related S. Korean Patent Application No. 10-2022-7036132.
Japanese Office Action dated Sep. 13, 2022 for the counterpart Japanese Patent Application No. 2020-548820. (see attached English translations).
Taiwanese Office Action dated Dec. 29, 2022 corresponding to the related Taiwanese Patent Application No. 110126752.
Extended European Search Report mailed on Jan. 24, 2023 corresponding to the related European Patent Application No. 22202233.7.
Japanese Notice of Reasons for Rejection mailed on Jan. 9, 2024 corresponding to the related Japanese Patent Application No. 2023-008471.
S. Korean Notice of Allowance mailed on Apr. 22, 2024 corresponding to the related S. Korean Patent Application No. 2022-7036132.
Japanese Decision to Grant mailed on Apr. 23, 2024 corresponding to the related Japanese Patent Application No. 2023-008471.
Chinese Office Action mailed on Mar. 9, 2024 corresponding to the related Chinese Patent Application No. 201980018437.9.
European Examiner's Report mailed on May 28, 2024 corresponding to the related European Patent Application No. 22 202 233.7.

* cited by examiner

FIGURE 11

| | WL | WL-unsel | BL | BL-unsel | SL | SL-unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

FIGURE 13

|  | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~0.3-1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 15

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

FIGURE 17

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/ 0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/ 0V | 0.1-1uA | Vinh (1-2V) | 4-11V | 0-2.6V | 0-2.6V | 4.5-5V | 0-2.6V | 4.5-5V | 0-1V |

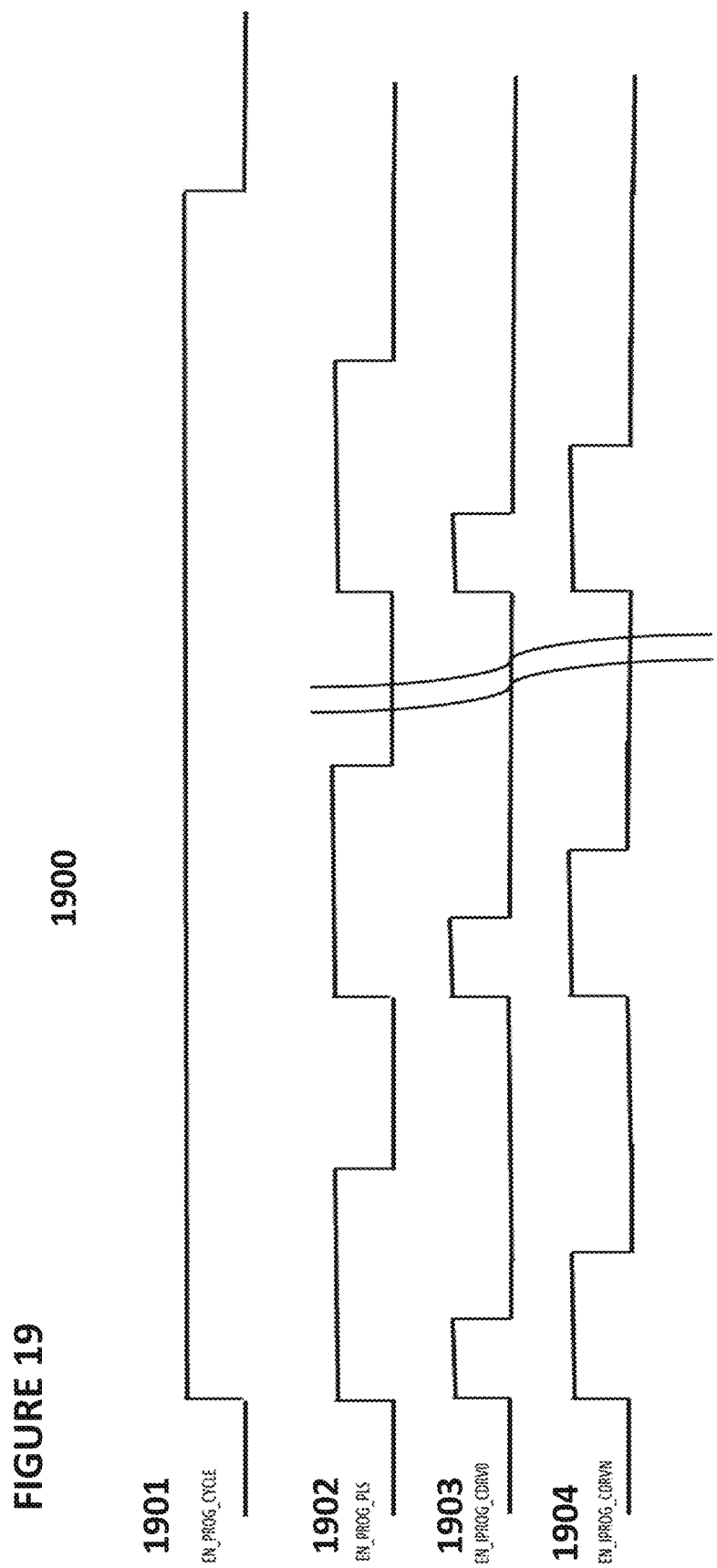

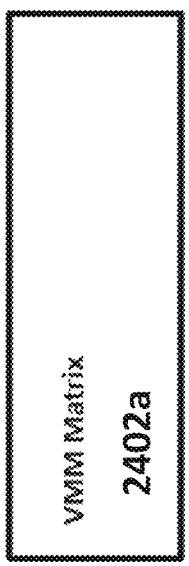
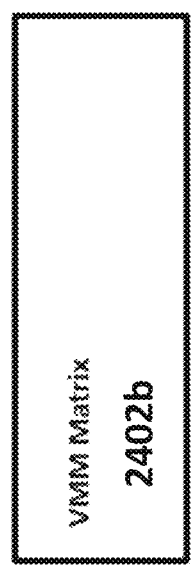
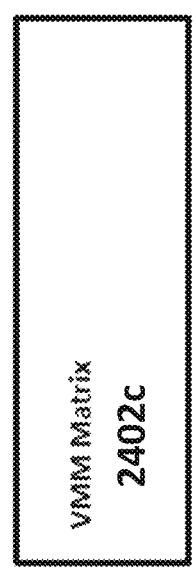
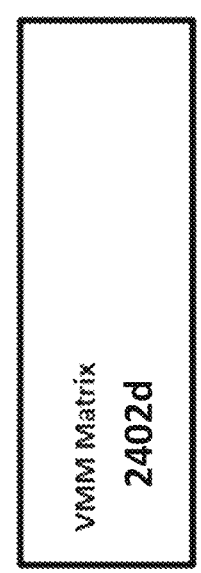
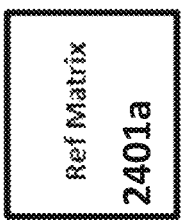
FIGURE 24

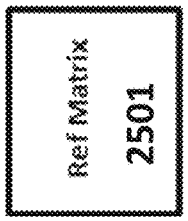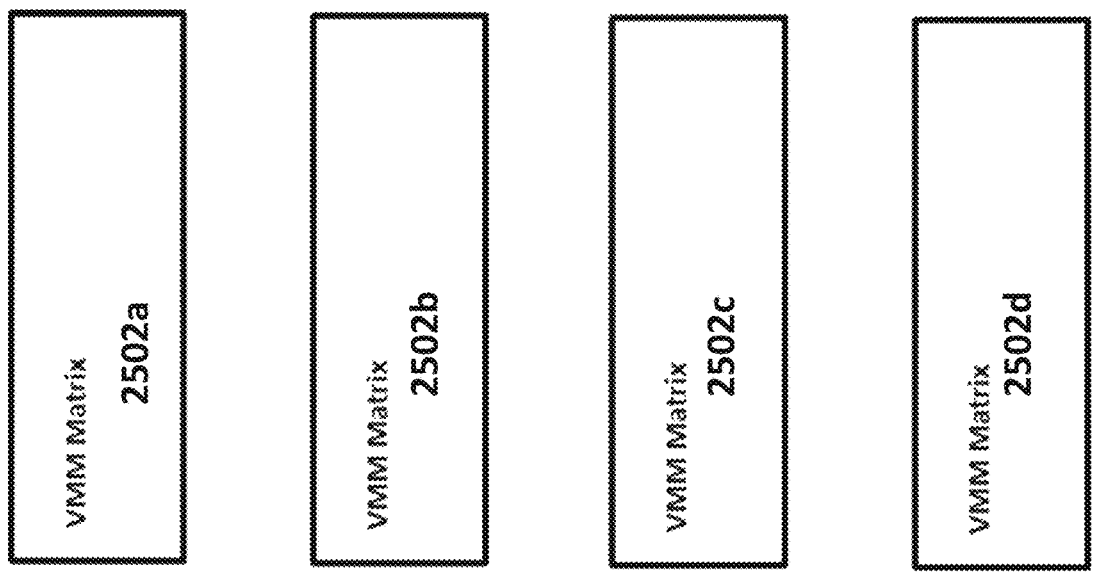
FIGURE 25

3200

VERIFYING OR READING A CELL IN AN ANALOG NEURAL MEMORY IN A DEEP LEARNING ARTIFICIAL NEURAL NETWORK

PRIORITY CLAIM

This application is a divisional of U.S. patent application Ser. No. 15/990,395, filed on May 25, 2018, and titled, "Method and Apparatus for Programming Analog Neuromorphic Memory in an Artificial Neural Network," which claims priority to U.S. Provisional Patent Application No. 62/642,878, filed on Mar. 14, 2018, and titled "Method and Apparatus for Programming Analog Neuromorphic Memory in an Artificial Neural Network," both of which are incorporated by reference herein.

FIELD OF THE INVENTION

Numerous embodiments of a reading and verifying apparatus and method for use with a vector-by-matrix multiplication (VMM) array in an artificial neural network are disclosed.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

One challenge in VMM systems is the ability to program selected cells with the precision and granularity required for different values of N. For example, if a selected cell can include one of 64 different values, extreme precision is required in program operations.

What is needed are improved programming, verifying, and reading systems and methods suitable for use with a VMM in an analog neuromorphic memory system.

SUMMARY OF THE INVENTION

Numerous embodiments of programming, verifying, and reading systems and methods for use with a vector-by-matrix multiplication (VMM) array in an artificial neural network are disclosed. Selected cells thereby can be programmed and verified with extreme precision to hold one of N different values. During a read operation, the system determines which of the N different values is stored in a selected cell.

BRIEF DESCRIPTION OF THE DRAWINGS

FIG. 11 depicts operating voltages to perform operations on the vector multiplier matrix of FIG. 10.

FIG. 13 depicts operating voltages to perform operations on the vector multiplier matrix of FIG. 12.

FIG. 15 depicts operating voltages to perform operations on the vector multiplier matrix of FIG. 14.

FIG. 17 depicts operating voltages to perform operations on the vector multiplier matrix of FIG. 216.

FIG. 19 depict waveforms for the programming of FIGS. 18A and 18B.

FIG. 24 depicts a plurality of reference matrices.

FIG. 25 depicts a single reference matrix.

DETAILED DESCRIPTION OF THE INVENTION

The artificial neural networks of the present invention utilize a combination of CMOS technology and non-volatile memory arrays.

Non-Volatile Memory Cells

Figure 1:
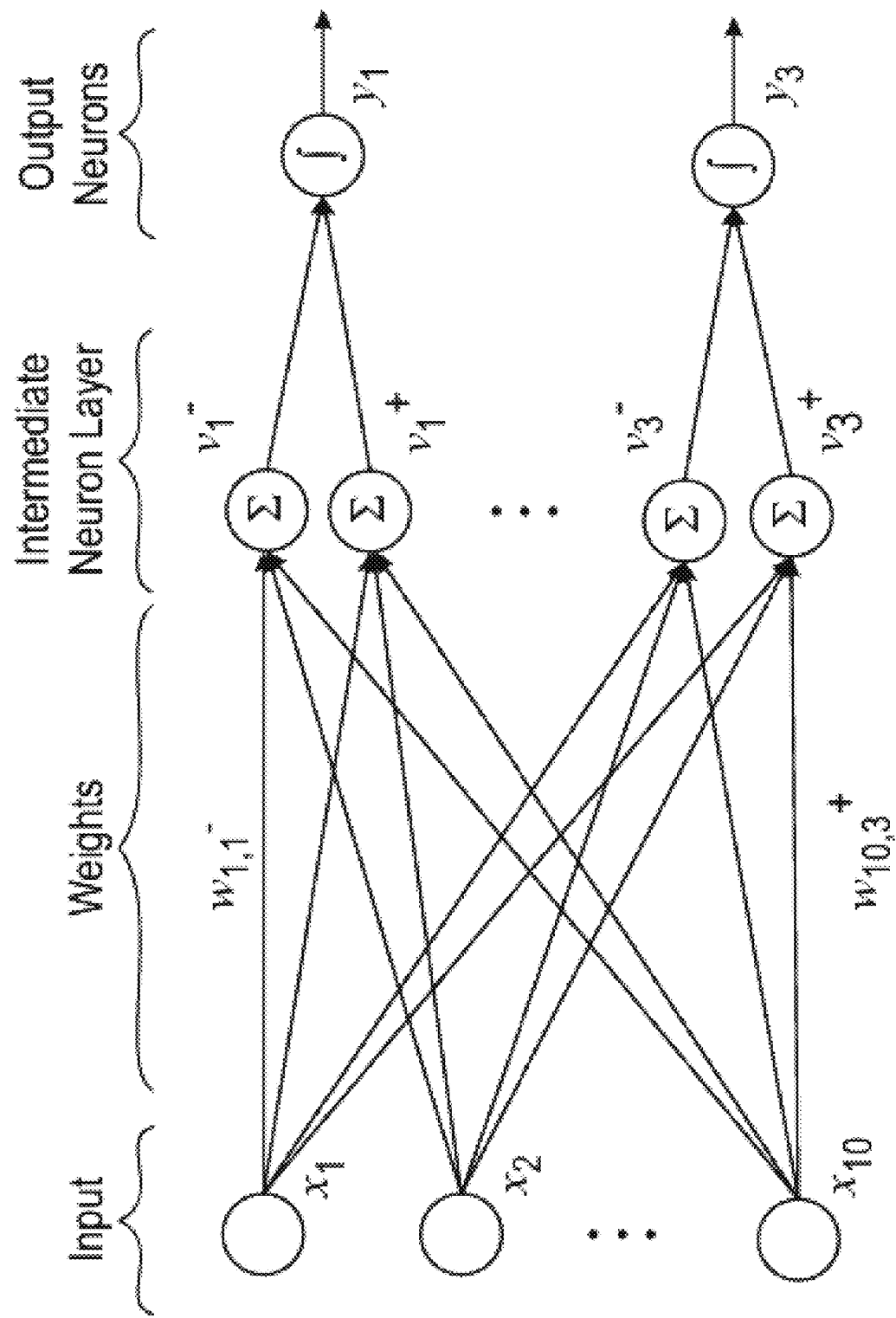
FIG. 1 is a diagram that illustrates an artificial neural network.
Figure 2:
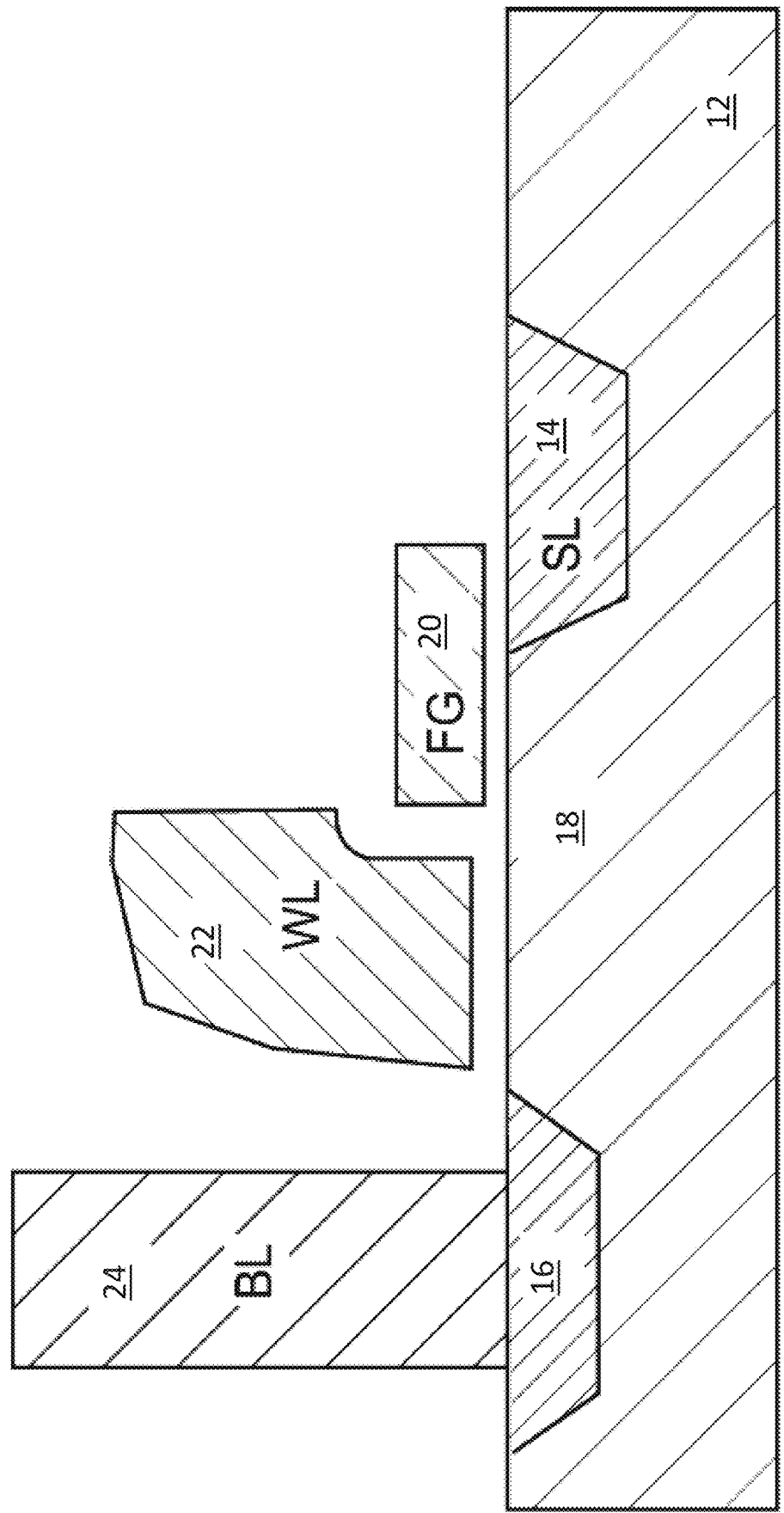
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE No. 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 1-3 µA | 9-10 V |

Figure 3:
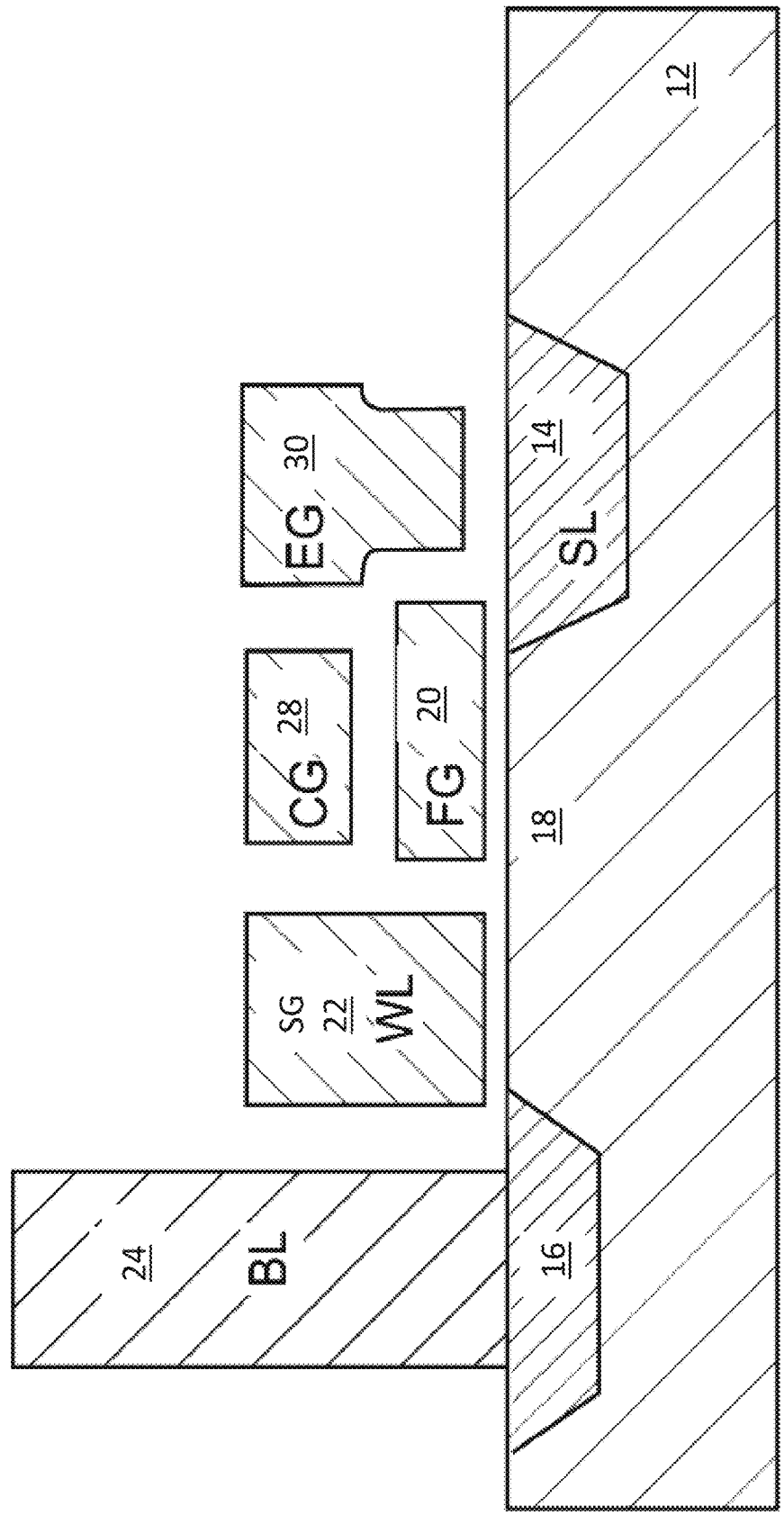
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 22 (typically coupled to a word line) over a second portion of the channel region 18, a control gate 28 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE No. 2

| Operation of Flash Memory Cell 310 of FIG. 3 | | | | |
|---|---|---|---|---|
| | WL/SG | BL | CG | EG | SL |
| Read | 1.0-2 V | 0.6-2 V | 0-2.6 V | 0-2.6 V | 0 V |
| Erase | -0.5 V/0 V | 0 V | 0 V/-8 V | 8-12 V | 0 V |
| Program | 1 V | 1 µA | 8-11 V | 4.5-9 V | 4.5-5 V |

Figure 4:
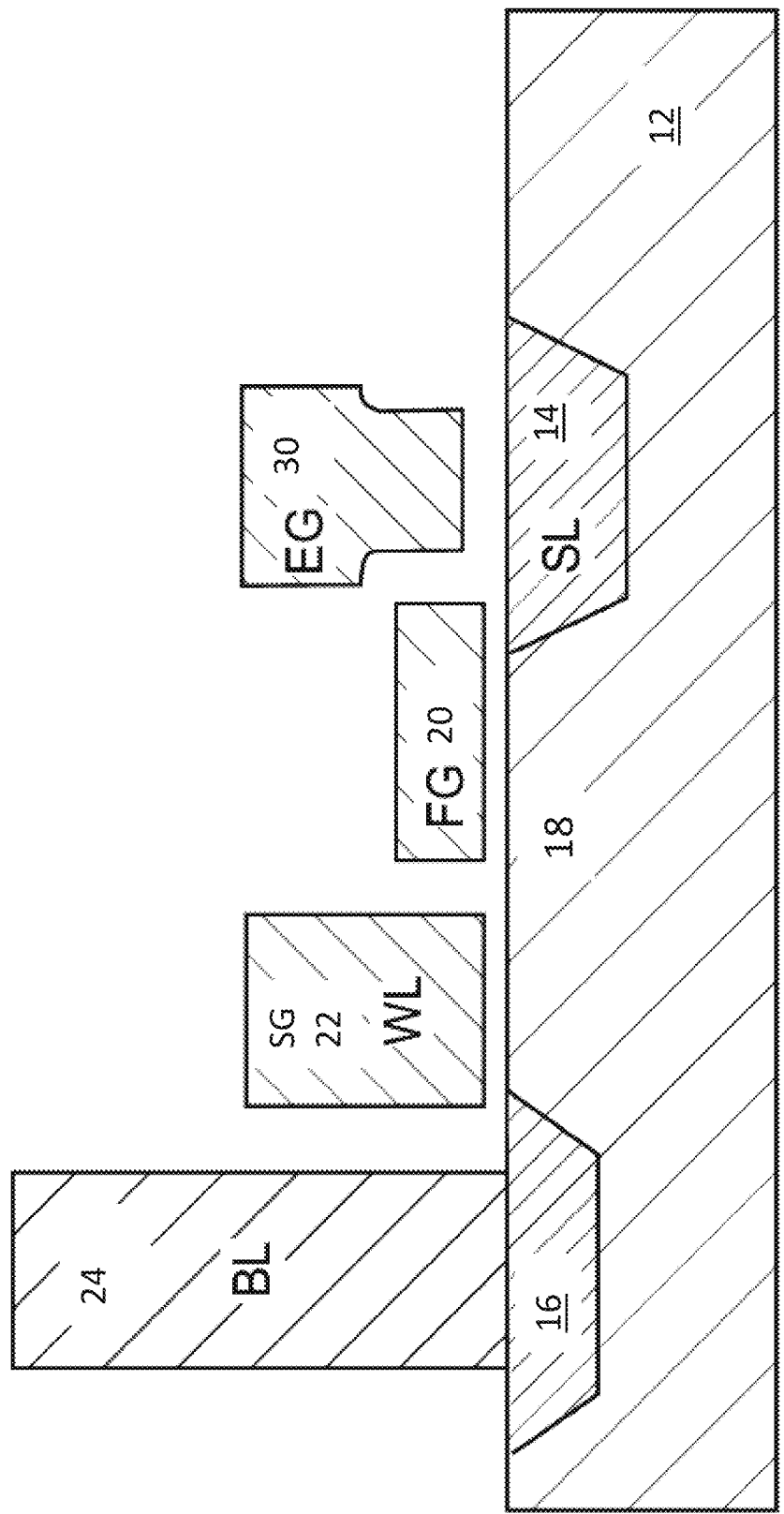
FIG. 4 is a side cross-sectional side view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE No. 3

| Operation of Flash Memory Cell 410 of FIG. 4 | | | |
|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 5:
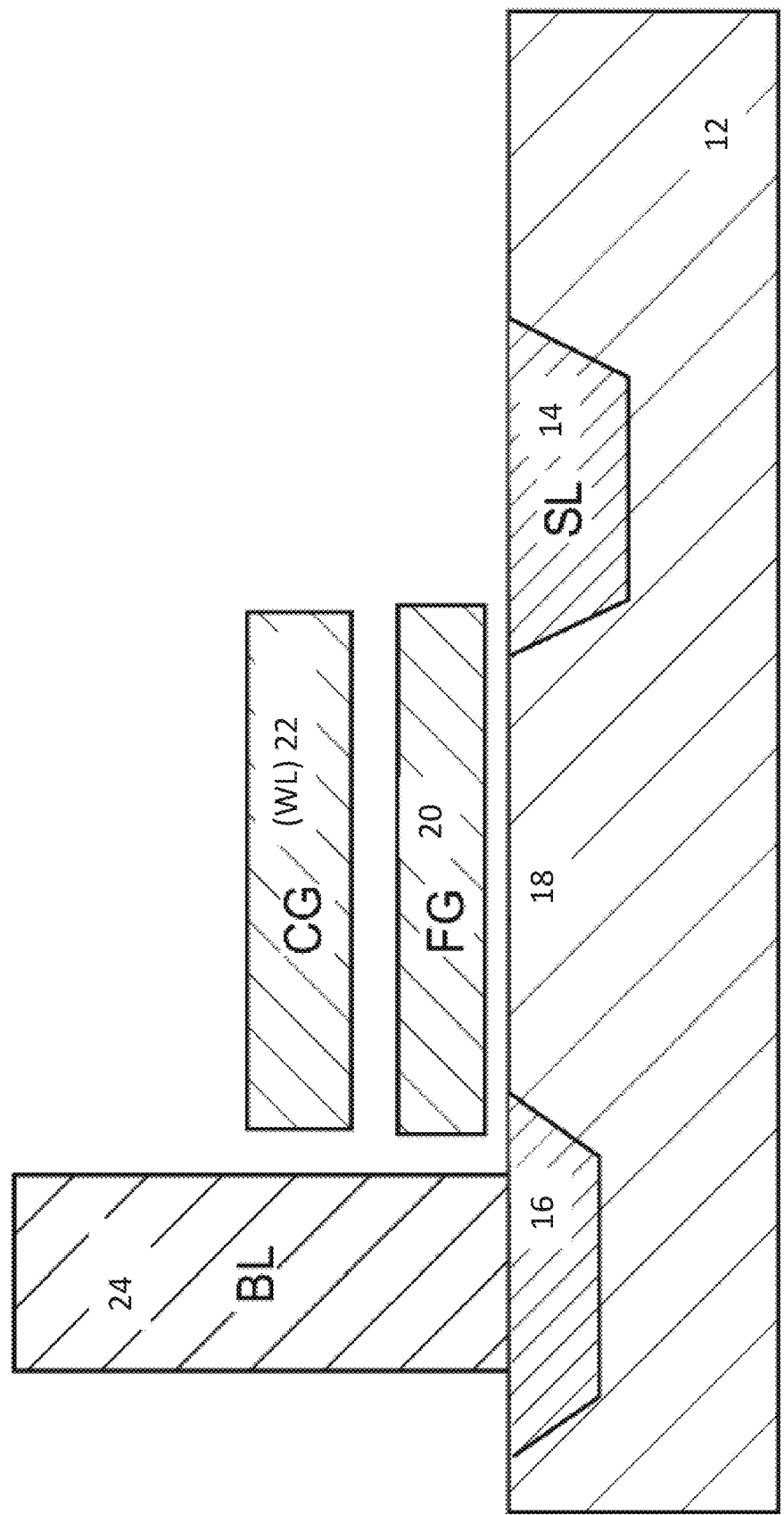
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE No. 4

| Operation of Flash Memory Cell 510 of FIG. 5 | | | |
|---|---|---|---|
| | CG | BL | SL | P-sub |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
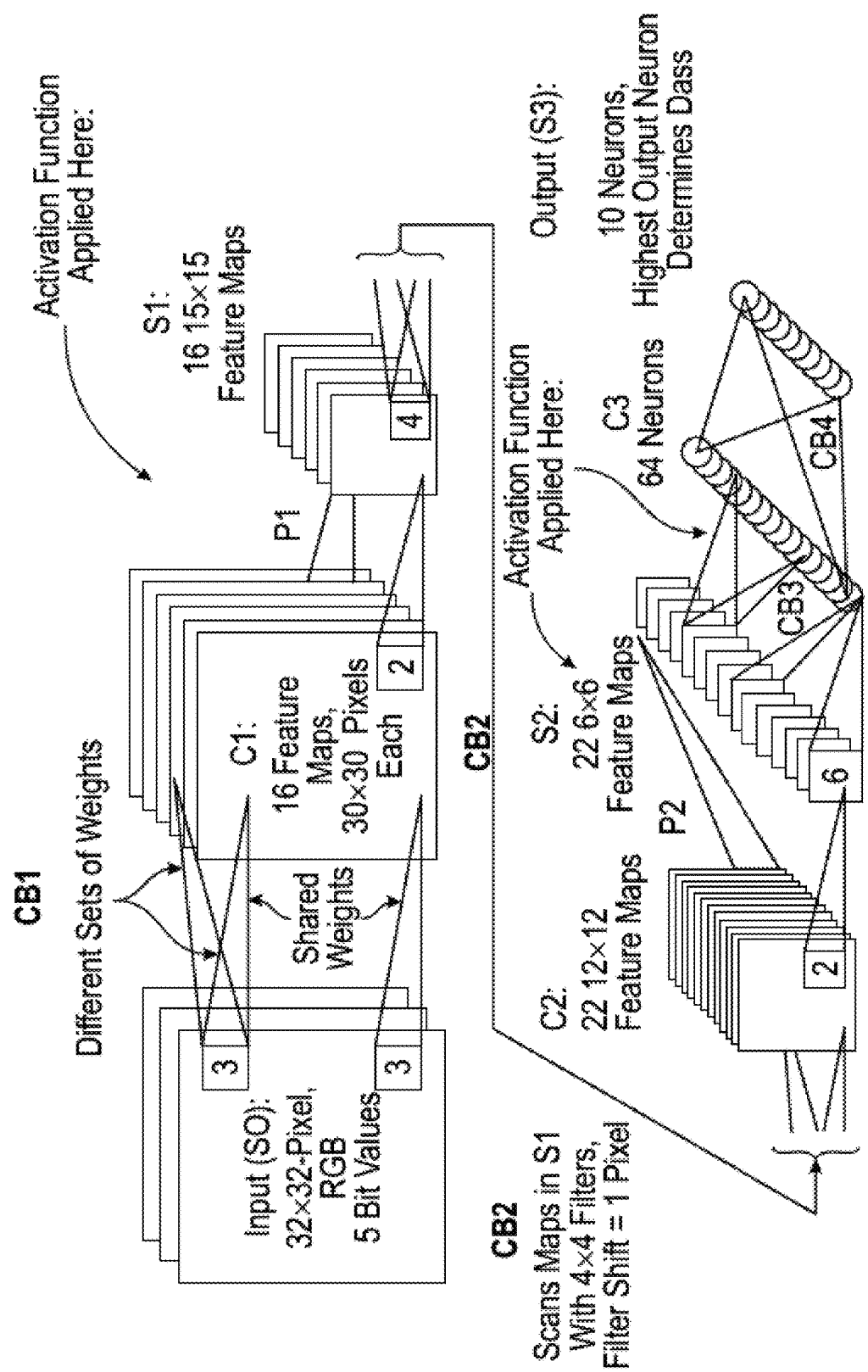
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
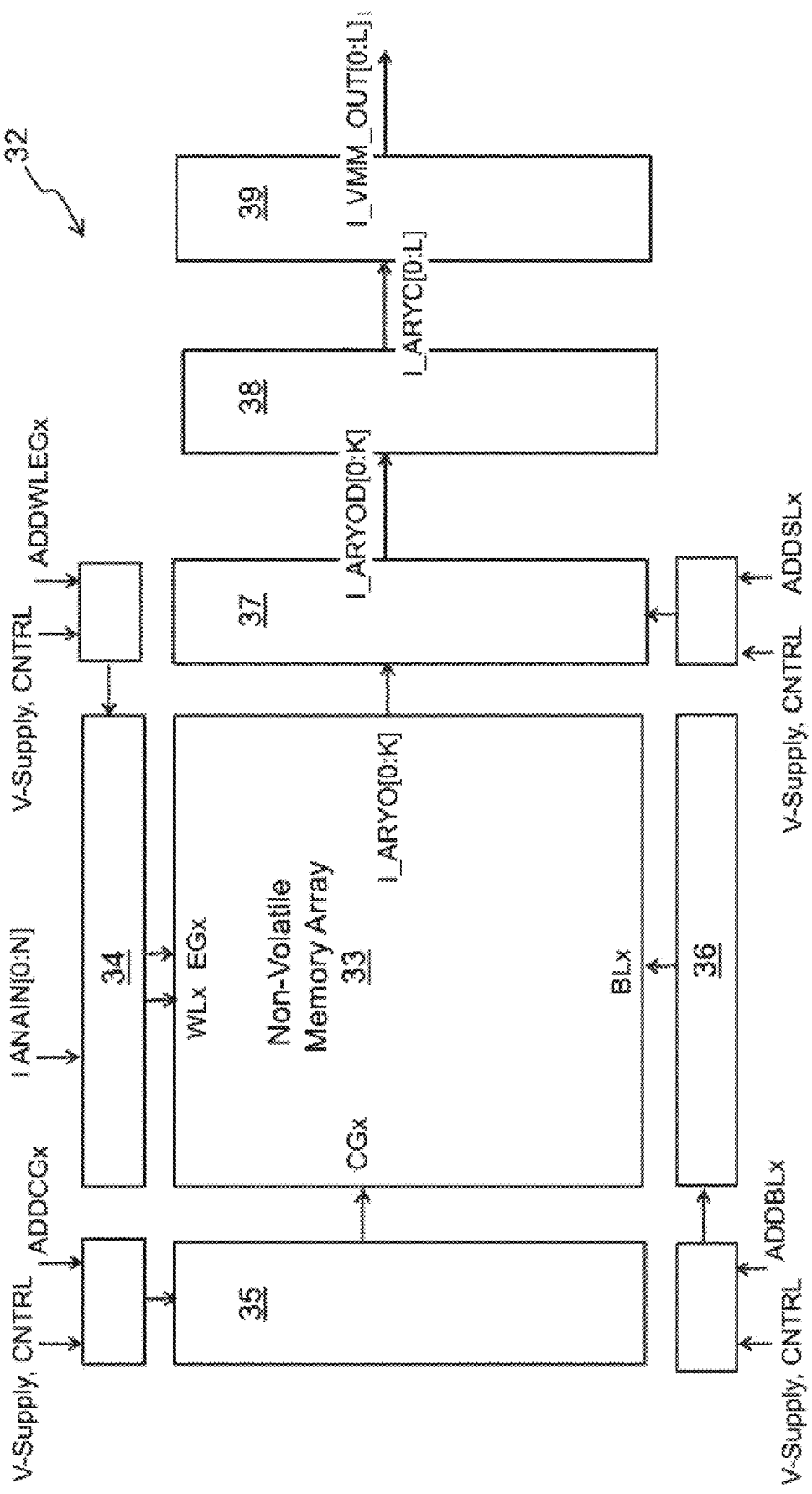
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tanh, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
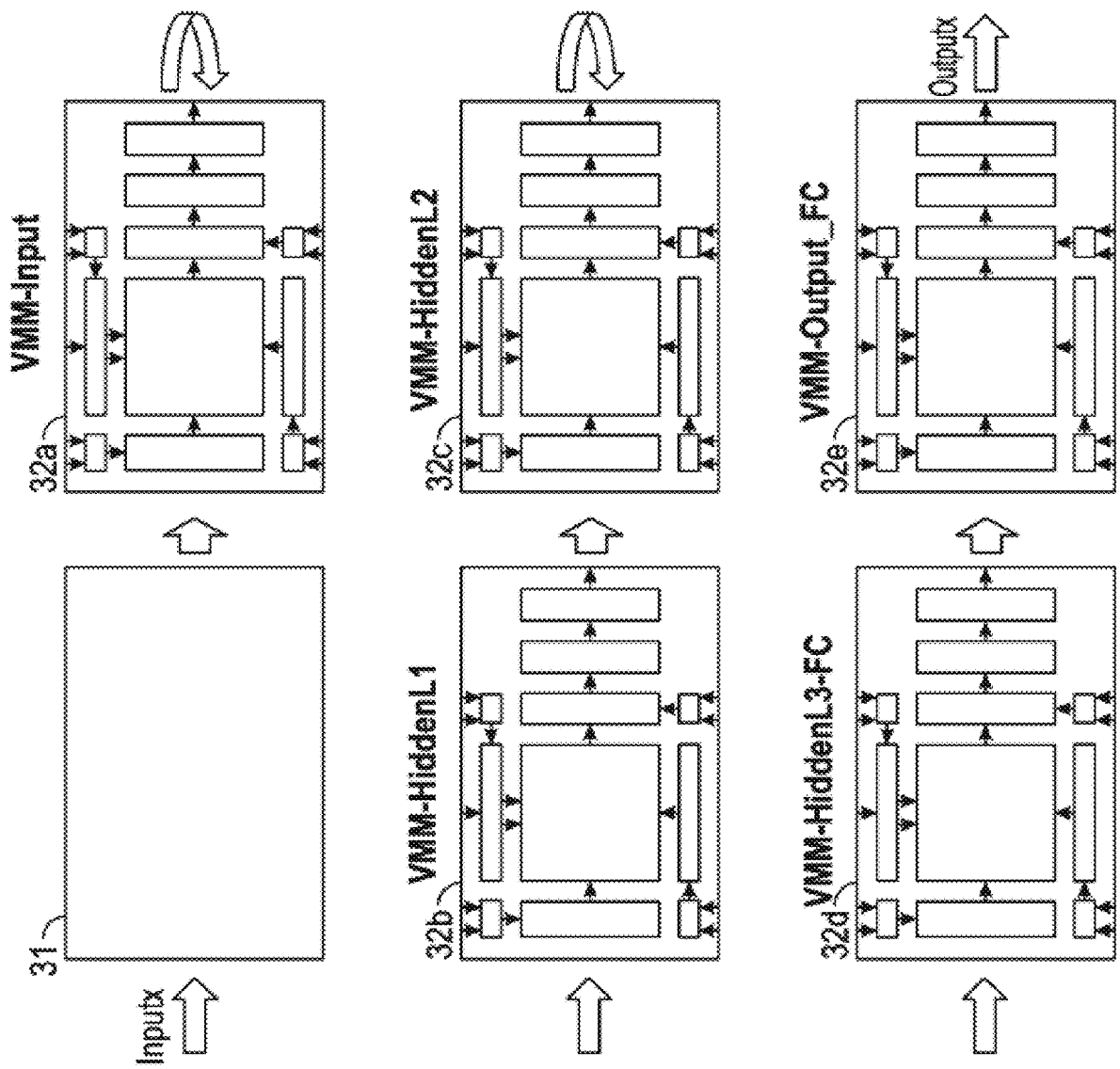
FIG. 8 is a block diagram illustrating various levels of a vector multiplier matrix.

FIG. 8 is a block diagram of the various levels of VMM. As shown in FIG. 8, the input is converted from digital to analog by digital-to-analog converter 31, and provided to input VMM 32a. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. The example shown in FIG. 8 contains five layers (32a, 32b, 32c, 32d, 32e): one input layer (32a), two hidden layers (32b, 32c), and two fully connected layers (32d, 32e). One of ordinary skill in the art will appreciate that this is merely exemplary and that a system instead could comprise more than two hidden layers and more than two fully connected layers.

Vector-By-Matrix Multiplication (VMM) Arrays

Figure 9:
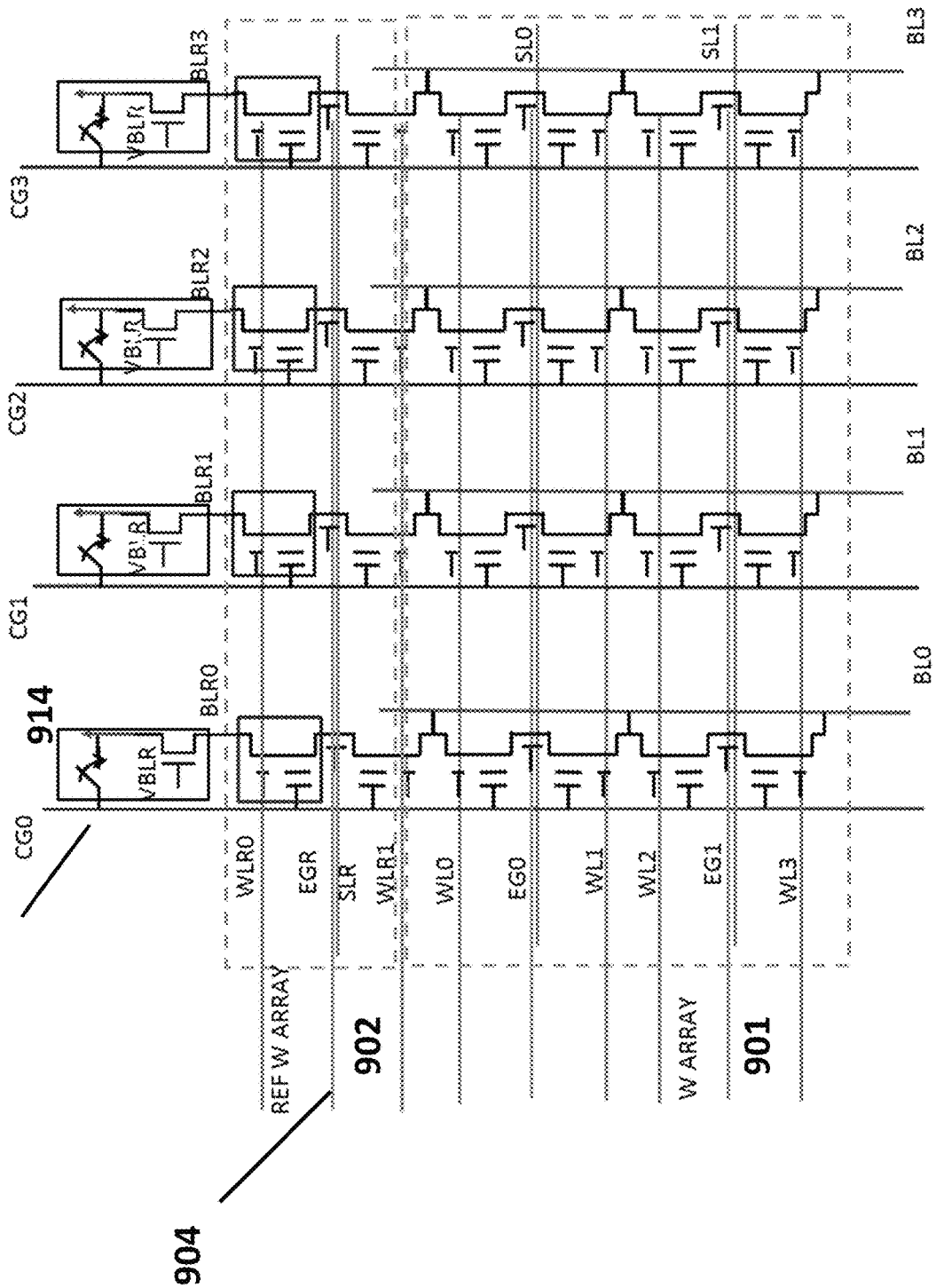
FIG. 9 depicts another embodiment of a vector multiplier matrix.

FIG. 9 depicts neuron VMM 900, which is particularly suited for memory cells of the type shown in FIG. 3, and is utilized as the synapses and parts of neurons between an input layer and the next layer. VMM 900 comprises a memory array 901 of non-volatile memory cells and reference array 902 (at the top of the array). Alternatively, another reference array can be placed at the bottom. In VMM 900, control gates line such as control gate line 903 run in a vertical direction (hence reference array 902 in the row direction, orthogonal to the input control gate lines), and erase gate lines such as erase gate line 904 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = Io * e^{(Vg-Vth)/kVt} = w * Io * e^{(Vg)/kVt}$$

$$w = e^{(-Vth)/kVt}$$

For an I-to-V log converter using a memory cell to convert input current into an input voltage:

$$Vg = k * Vt * \log[Ids/wp * Io]$$

For a memory array used as a vector matrix multiplier VMM, the output current is:

$$Iout = wa * Io * e^{(Vg)/kVt}, \text{ namely}$$

$$Iout = (wa/wp) * Iin = W * Iin$$

$$W = e^{(Vthp-Vtha)/kVt}$$

A wordline or control gate can be used as the input for the memory cell for the input voltage.

Alternatively, the flash memory cells can be configured to operate in the linear region:

$$Ids = \text{beta} * (Vgs-Vth) * Vds; \text{ beta} = u * Cox * W/L$$

$$W \alpha (Vgs-Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826, 345, which is incorporated by reference herein. A sourceline or a bitline can be used as the neuron output (current summation output).

Figure 10:
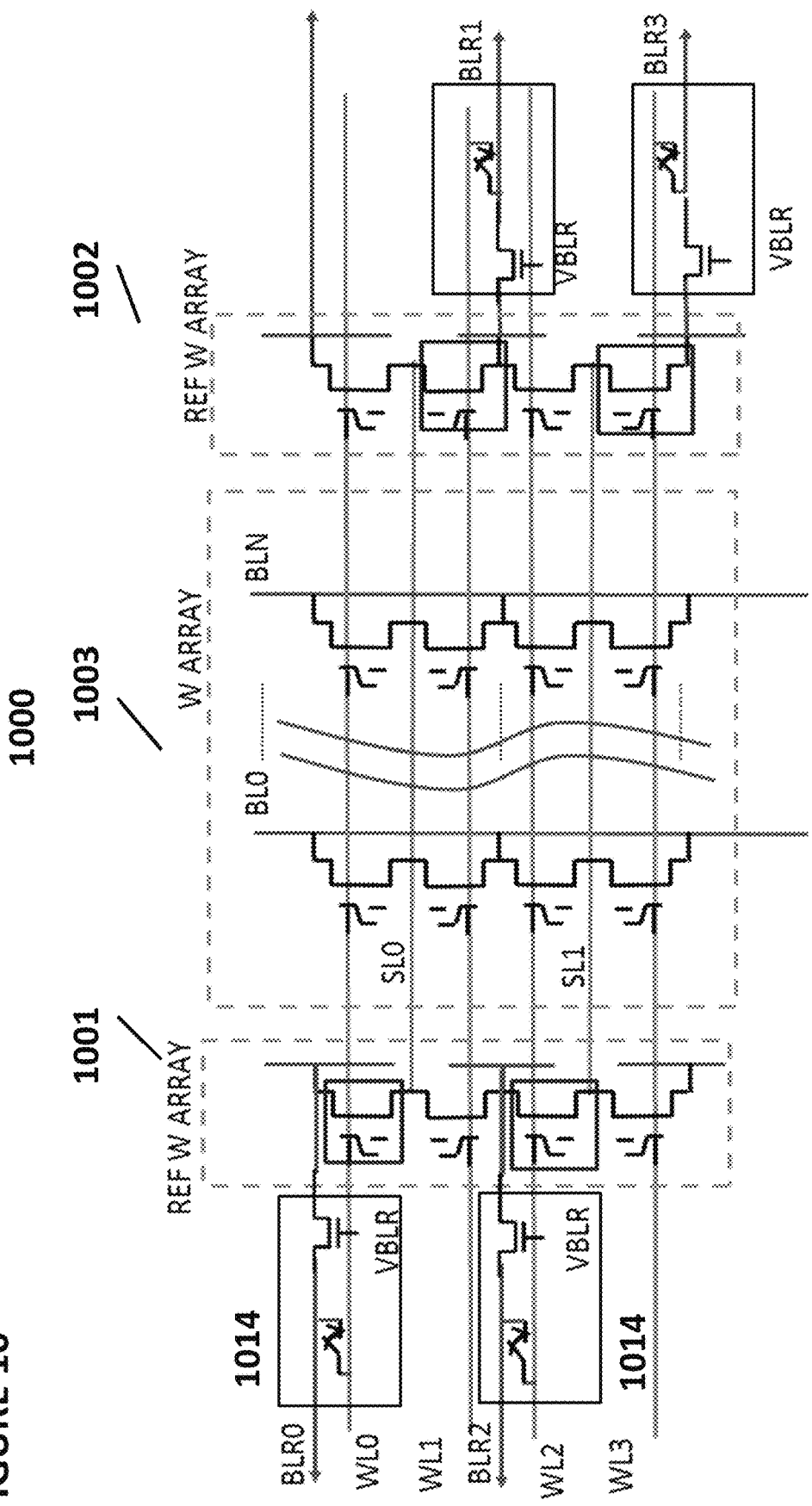
FIG. 10 depicts another embodiment of a vector multiplier matrix.

FIG. 10 depicts neuron VMM 1000, which is particularly suited for memory cells of the type shown in FIG. 2, and is utilized as the synapses between an input layer and the next layer. VMM 1000 comprises a memory array 1003 of non-volatile memory cells, reference array 1001, and reference array 1002. Reference arrays 1001 and 1002, in column direction of the array, serve to convert current inputs flowing into terminals BLR0-3 into voltage inputs WL0-3. In effect, the reference memory cells are diode connected through multiplexors with current inputs flowing into them. The reference cells are tuned (e.g., programmed) to target reference levels. The target reference levels are provided by a reference mini-array matrix. Memory array 1003 serves two purposes. First, it stores the weights that will be used by the VMM 1000. Second, memory array 1003 effectively multiplies the inputs (current inputs provided in terminals BLR0-3; reference arrays 1001 and 1002 convert these current inputs into the input voltages to supply to wordlines WL0-3) by the weights stored in the memory array to produce the output, which will be the input to the next layer or input to the final layer. By performing the multiplication function, the memory array negates the need for separate multiplication logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 11 depicts operating voltages for VMM 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 12:
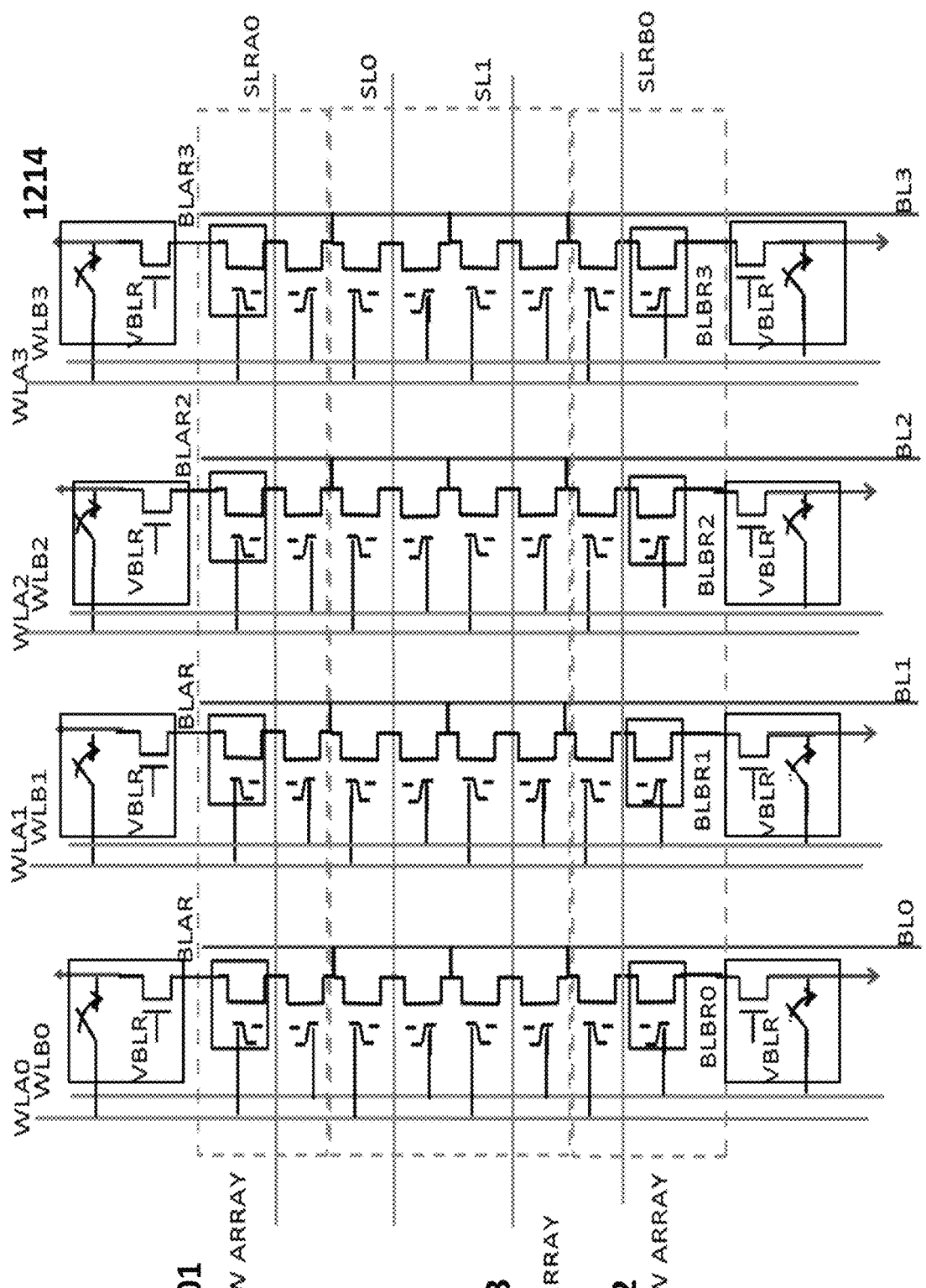
FIG. 12 depicts another embodiment of a vector multiplier matrix.

FIG. 12 depicts neuron VMM 1200, which is particularly suited for memory cells of the type shown in FIG. 2, and is utilized as the synapses and parts of neurons between an input layer and the next layer. VMM 1200 comprises a memory array 1203 of non-volatile memory cells, reference array 1201, and reference array 1202. The reference array 1201 and 1202 run in row direction of the array VMM 1200 is similar to VMM 1000 except that in VMM 1200 the word lines run in the vertical direction. Here, the inputs are provided on the word lines, and the output emerges on the source line during a read operation. The current placed on the source line performs a summing function of all the currents from the memory cells connected to the source line.

FIG. 13 depicts operating voltages for VMM 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 14:
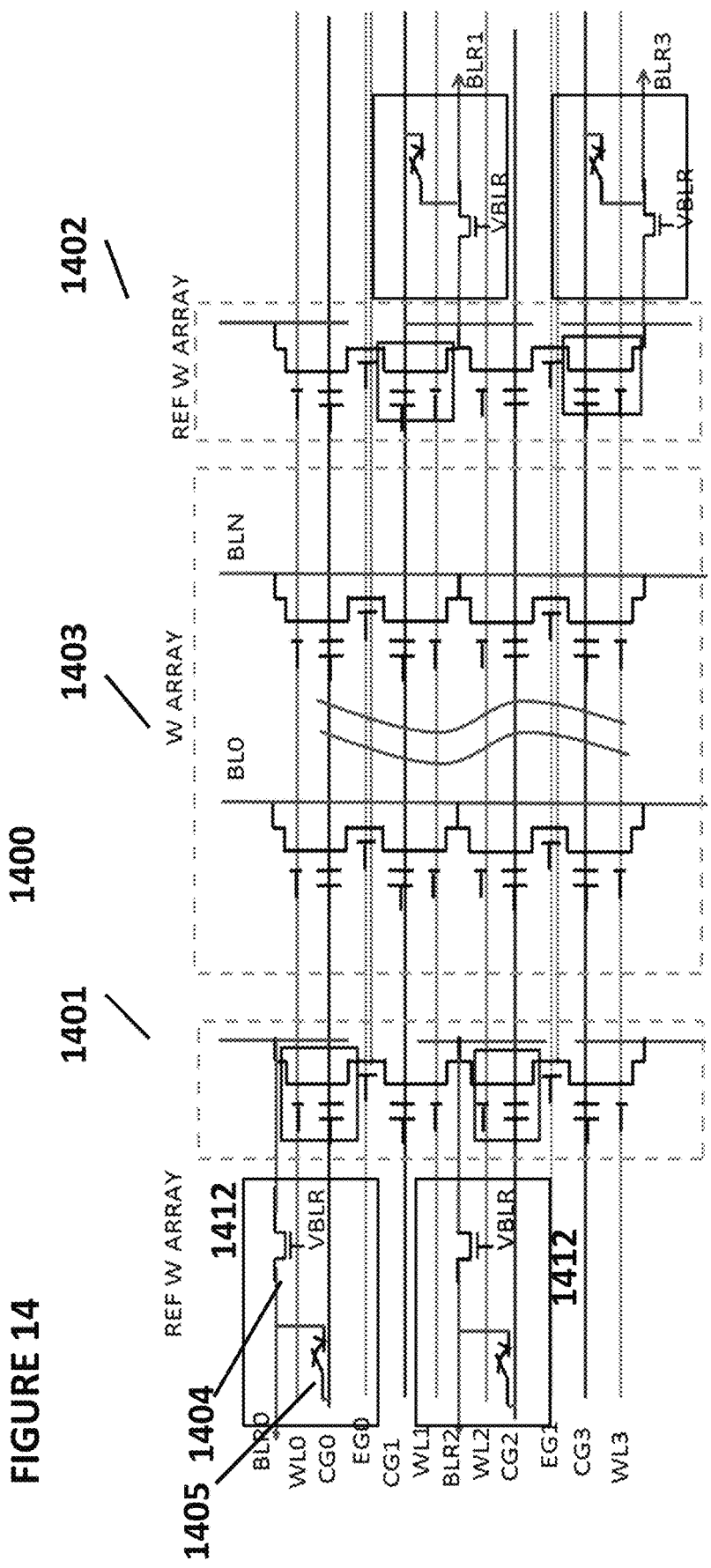
FIG. 14 depicts another embodiment of a vector multiplier matrix.

FIG. 14 depicts neuron VMM 1400, which is particularly suited for memory cells of the type shown in FIG. 3, and is utilized as the synapses and parts of neurons between an input layer and the next layer. VMM 1400 comprises a memory array 1403 of non-volatile memory cells, reference array 1401, and reference array 1402. The reference array 1401 and 1402 serves to convert current inputs flowing into terminals BLR0-3 into voltage inputs CG0-3. In effect, the reference memory cells are diode connected through cascoding mulitplexors 1414 with current inputs flowing into them. The mux 1414 includes a mux 1405 and a cascoding transistor 1404 to ensure a constant voltage on bitline of reference cells in read. The reference cells are tuned to target reference levels. Memory array 1403 serves two purposes. First, it stores the weights that will be used by the VMM 1400. Second, memory array 1403 effectively multiplies the inputs (current inputs provided to terminals BLR0-3; reference arrays 1401 and 1402 convert these current inputs into the input voltages to supply to the control gates CG0-3) by the weights stored in the memory array to produce the output, which will be the input to the next layer or input to the final layer. By performing the multiplication function, the memory array negates the need for separate multiplication logic circuits and is also power efficient. Here, the inputs are provided on the word lines, and the output emerges on the bitline during a read operation. The current placed on the bitline performs a summing function of all the currents from the memory cells connected to the bitline.

VMM 1400 implements uni-directional tuning for memory cells in memory array 1403. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 15 depicts operating voltages for VMM 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 16:
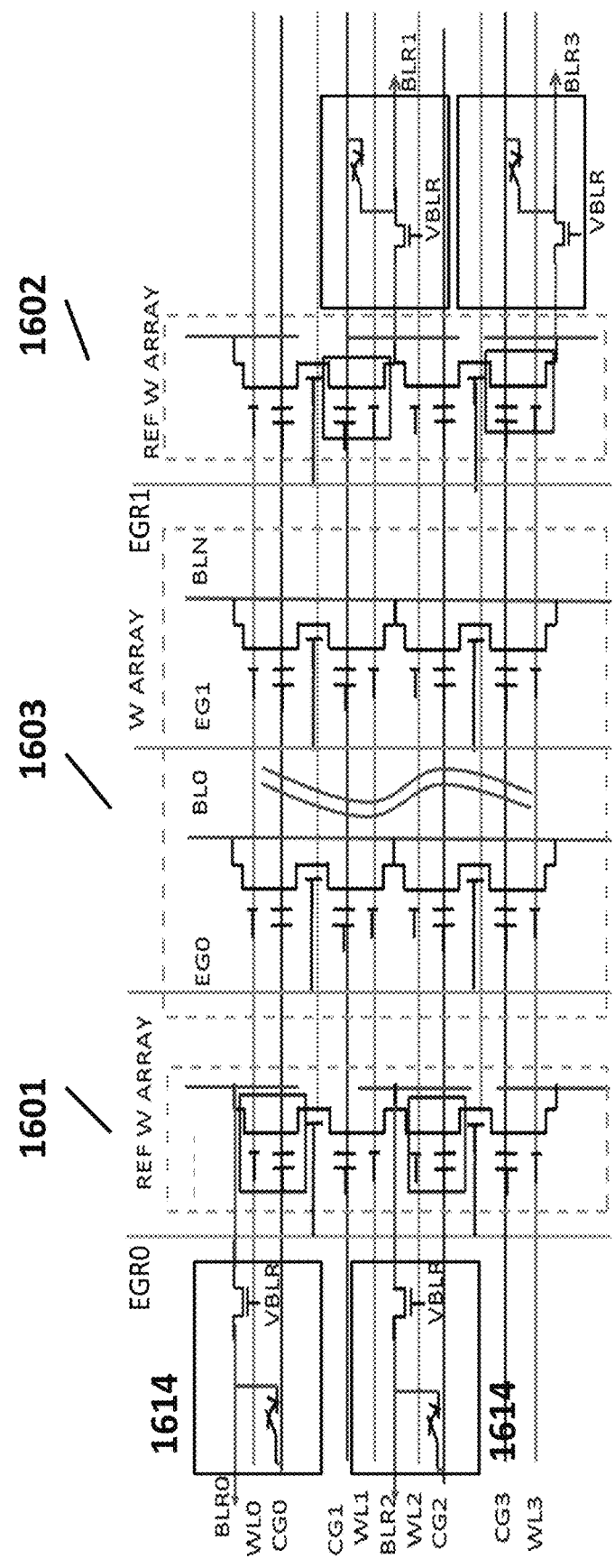
FIG. 16 depicts another embodiment of a vector multiplier matrix.

FIG. 16 depicts neuron VMM 1600, which is particularly suited for memory cells of the type shown in FIG. 3, and is utilized as the synapses and parts of neurons between an input layer and the next layer. VMM 1600 comprises a memory array 1603 of non-volatile memory cells, reference array 1601, and reference array 1602. EG lines are run vertically while CG and SL lines are run horizontally. VMM 1600 is similar to VMM 1400, except that VMM 1600 implements bi-directional tuning, where each individual cell can be completely erased, partially programmed, and partially erased as needed to reach the desired amount of charge on the floating gate. As shown, reference arrays 1601 and 1602 convert input current in the terminal BLR0-3 into control gate voltages CG0-3 (through the action of diode-connected reference cells through multiplexors) to be applied to the memory cells in the row direction. The current output (neuron) is in the bitline which sums all currents from the memory cells connected to the bitline.

FIG. 17 depicts operating voltages for VMM 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 18A:
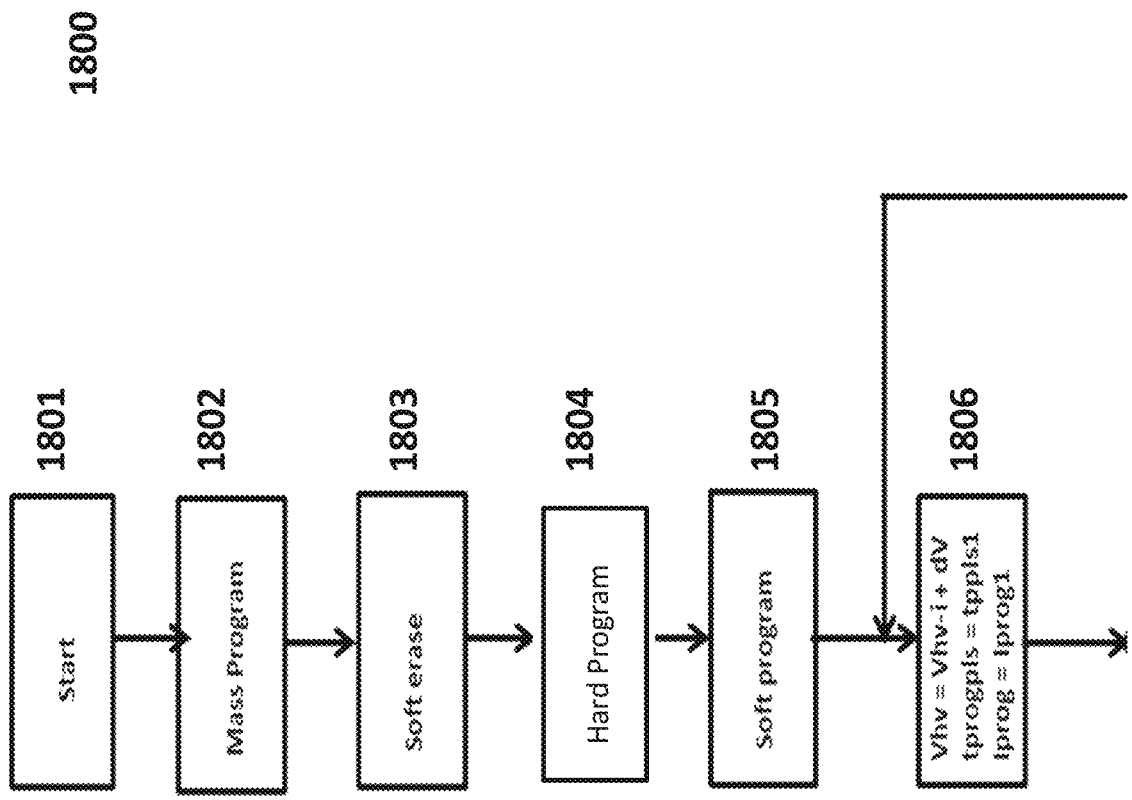
FIGS. 18A and 18B depict a programming method for a vector multiplier matrix.
Figure 18B:
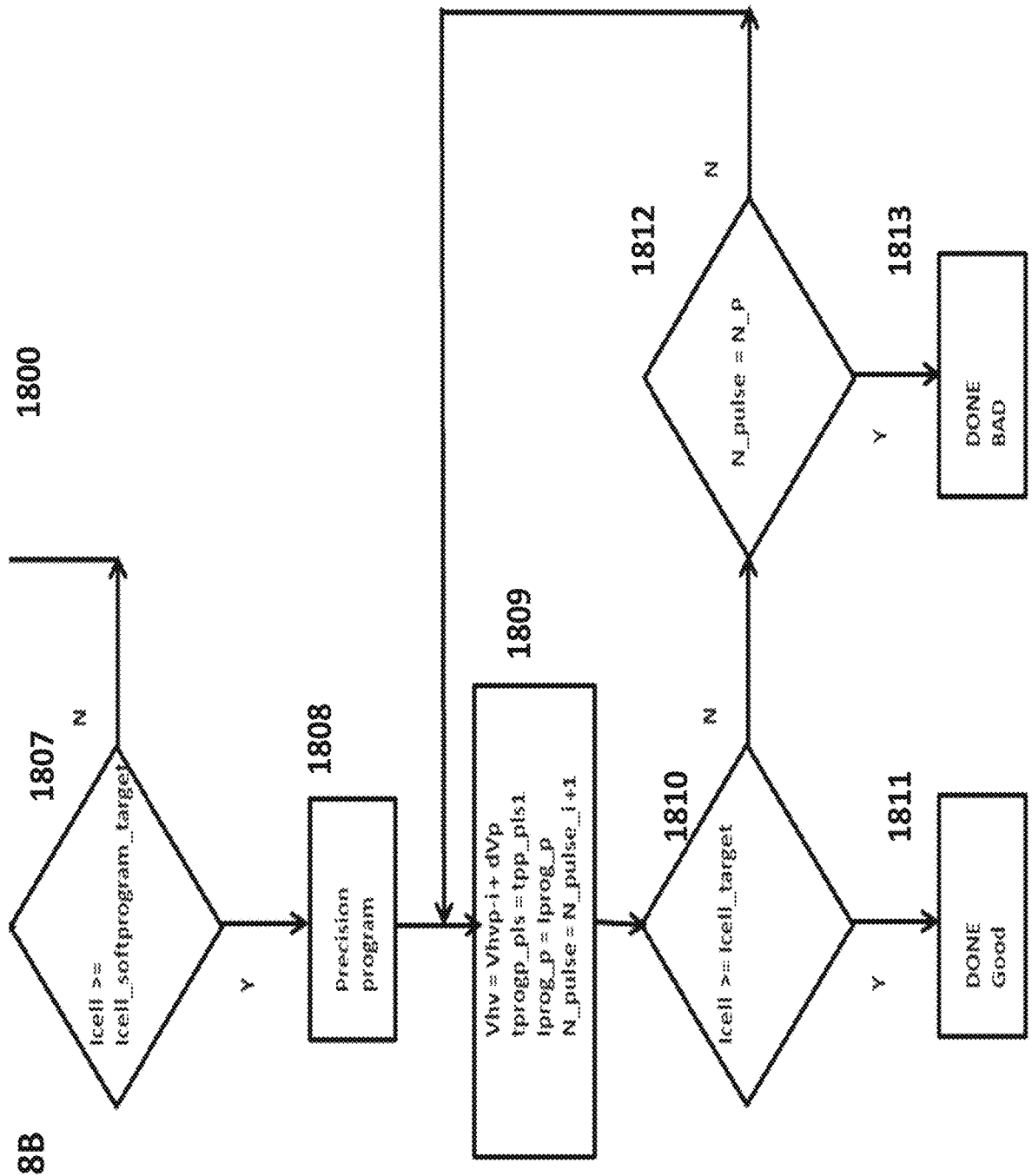

FIGS. 18A and 18B depict programming method 1800. First, the method starts (step 1801), which typically occurs in response to a program command being received. Next, a mass program operation programs all cells to a '0' state (step 1802). Then a soft erase erases all cells to an intermediate weakly erased level of approximately 3-5 µA (step 1803). This is in contrast to a deep erase would bring all cells to full erased state for digital application, e.g. ~20-30 uA cell current. Then, a hard program is performed on all unselected cells to remove charge from the cells (step 1804) for un-used cells to very deep programmed state, to make sure that the cells are really off, meaning these memory cells contributing insignificant current. A soft program is then performed on select cells to remove some charge from the cells, to an n intermediate weakly programmed level of approximately 0.7-1.5 µA using a coarse algorithm (steps 1805, 1806, 1807). A coarse step program cycle followed by a verify operation occurs, where the charge on a select cells is compared to various threshold values in a coarse iterative fashion (steps 1806 and 1807). The coarse step program cycle includes a coarse voltage increment, and/or coarse program time, and/or coarse program current resulting in a coarse cell current change from one program step to the next. Next, precision programming occurs (step 1808-1813), where all cells are programmed to a target level within a range of 100 pA-20 nA depending on desired level by a fine step program algorithm. A fine step program cycle followed by verify operation occurs (steps 1809 and 1810). The fine step program cycle may include a combination of coarse and fine resolution of voltage increment, and/or program time, and/or program current resulting in a fine cell current change from one program step to the next. If the selected cell reaches the desired target, the programming operation is complete (step 1811). If not, the precision programming operation is repeated until the desired level is reached. However, if the number of tries exceeds a threshold number (step 1812), the programming operation stops and the selected cell is deemed a bad cell (step 1813).

FIG. 19 depicts exemplary waveform 1900 for performing a programming operation using pulse modulation. Signal 1901 is program cycle enable signal, which consists of multiple program and verify cycles. Signal 1902 is an individual pulse program cycle enable signal (signal 1902=logic '1' to enable programming). Verify cycle follows the individual pulse program cycle (signal 1902=logic '0' to enabling verifying). Signal 1903 is an individual pulse program cycle enable signal for a particular bitline. Signal 1903 is an individual pulse program cycle enable signal for another particular bitline. As shown width of the signal 1903 is narrower than that of the signal 1904. It means the signal 1903 allows a smaller charge on the floating gate of the memory cell to be changed, leading to smaller current precision in programming. Within a program cycle 1901, different program pulse-width 1903 can be used to achieve desired programming precision for a particular memory cell.

Figure 20:
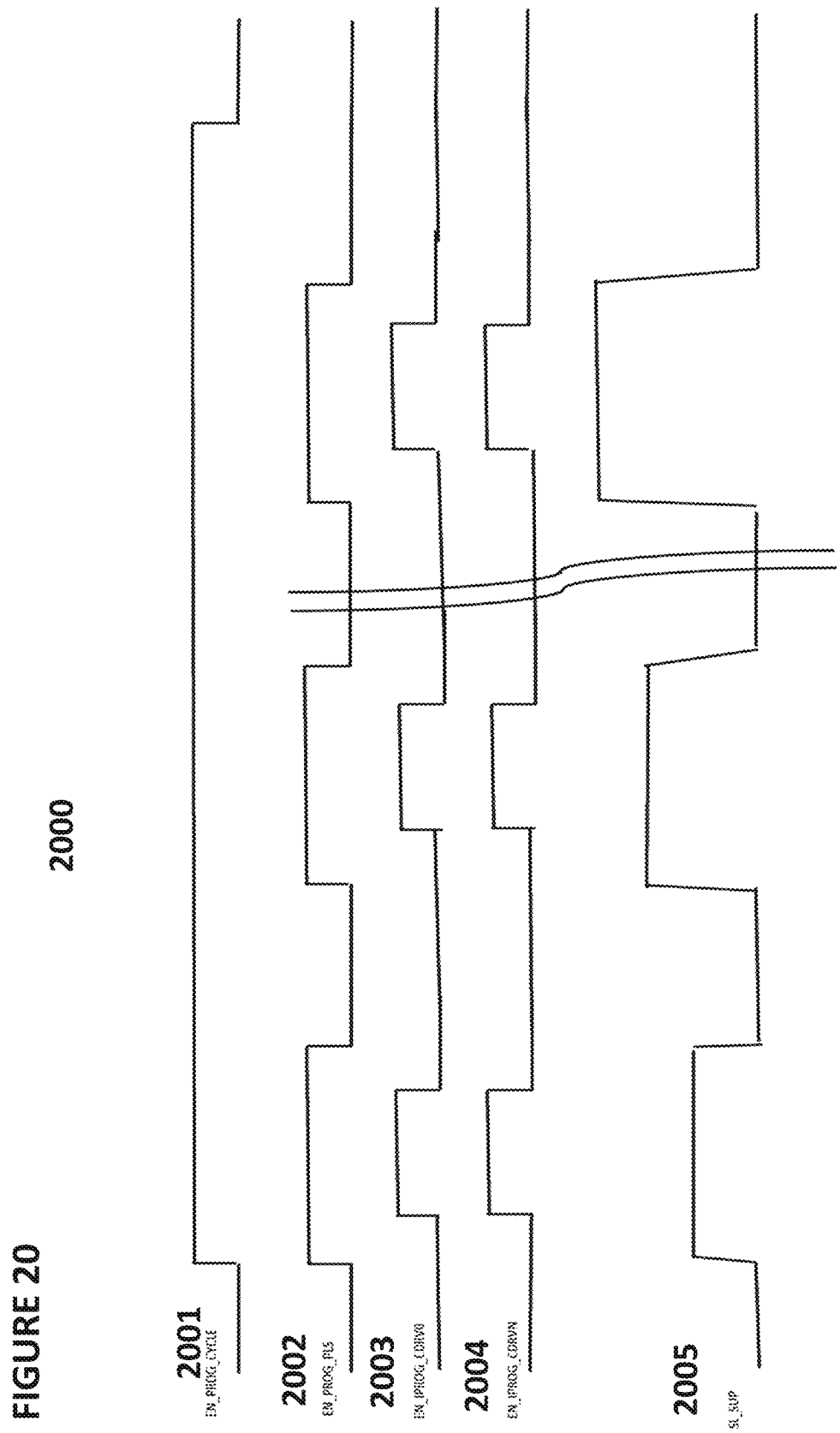
FIG. 20 depict waveforms for the programming of FIGS. 18A and 18B.

FIG. 20 depicts exemplary waveform 2000 for performing a programming operation using high voltage level modulation. Signal 2003 is an individual pulse program cycle enable signal for a particular bitline. Signal 2004 is an individual pulse program cycle enable signal for another particular bitline. Program pulse-width of signal 2003 and 2004 are the same in this waveform. Signal 2005 is a high voltage increment such as for source line or control gate for programming. It increments from one program pulse to the next.

Figure 21:
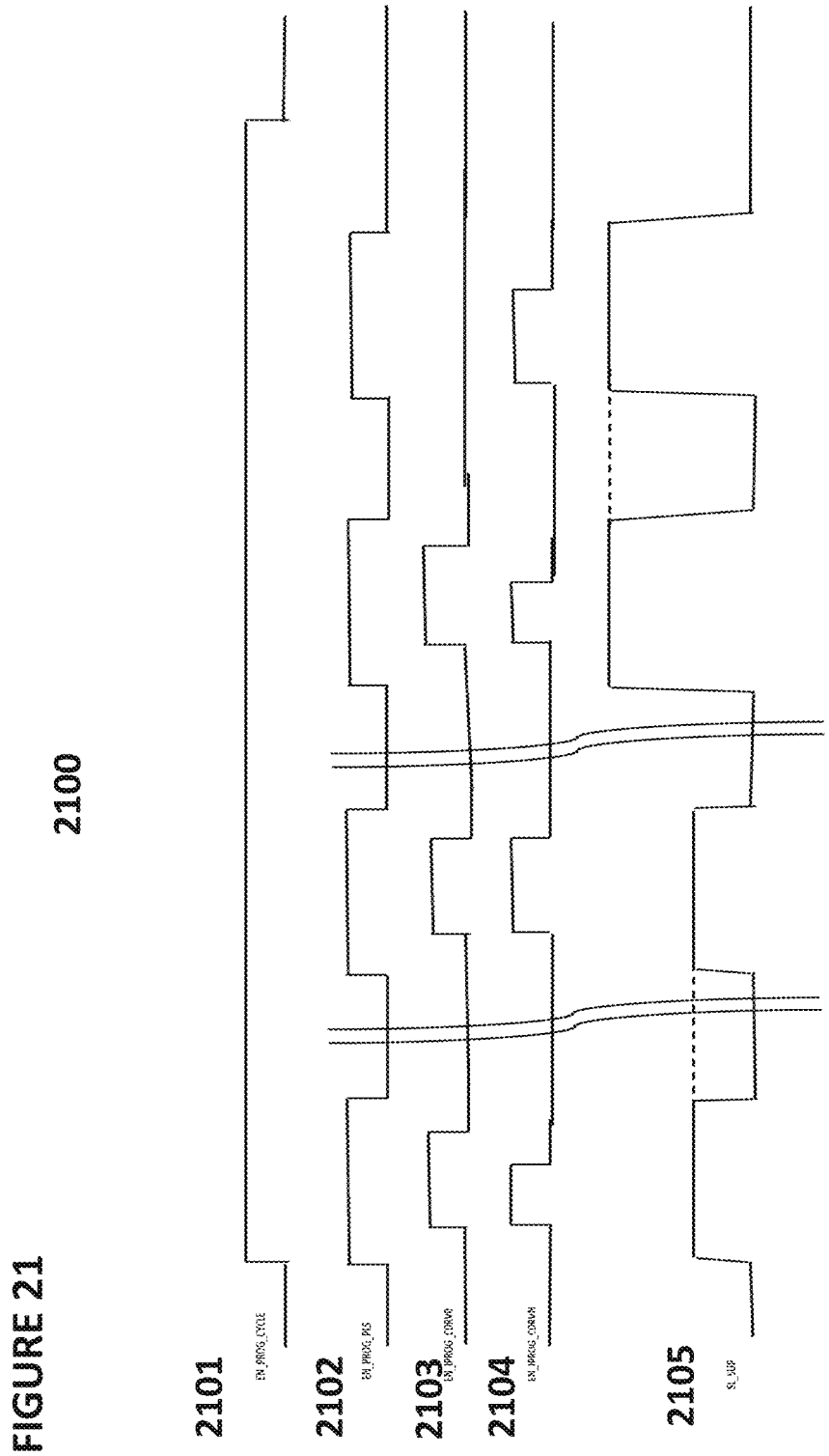
FIG. 21 depict waveforms for the programming of FIGS. 18A and 18B.

FIG. 21 depicts exemplary waveform 2100 for performing a programming operation using high voltage level modulation. Signal 2103 is an individual pulse program cycle enable signal for a particular bitline. Signal 2104 is an individual pulse program cycle enable signal for another particular bitline. Signal 2105 is a program high voltage increment such as for source line or control gate for programming. It may be the same or increments from one program pulse to the next. Program pulse-width of signal 2103 are the same across multiple pulses with increment high voltage. Program pulse-width of signal 2104 are different across multiple pulses, e.g., narrower for first pulse, for same high voltage increment.

Figure 22:
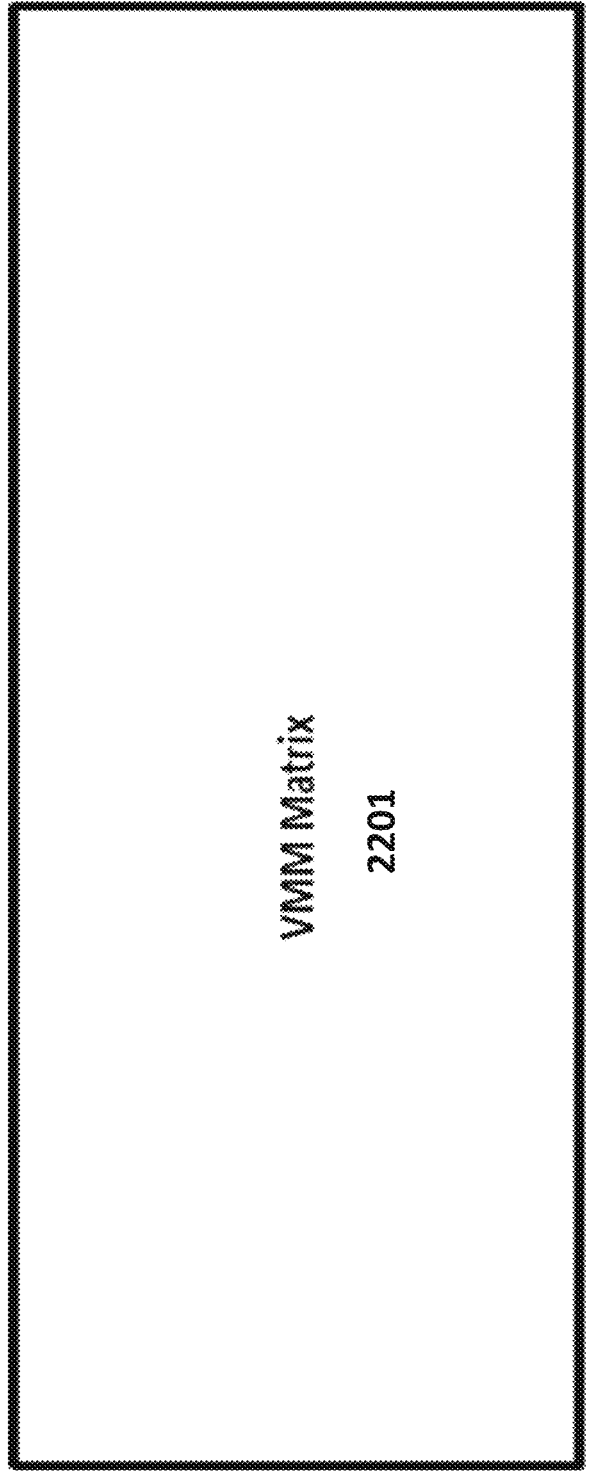
FIG. 22 depicts a vector multiplier matrix system.

FIG. 22 depicts VMM system 2200, comprising VMM matrix 2201, column decoders 2202, and column drivers 2203.

Figure 23:
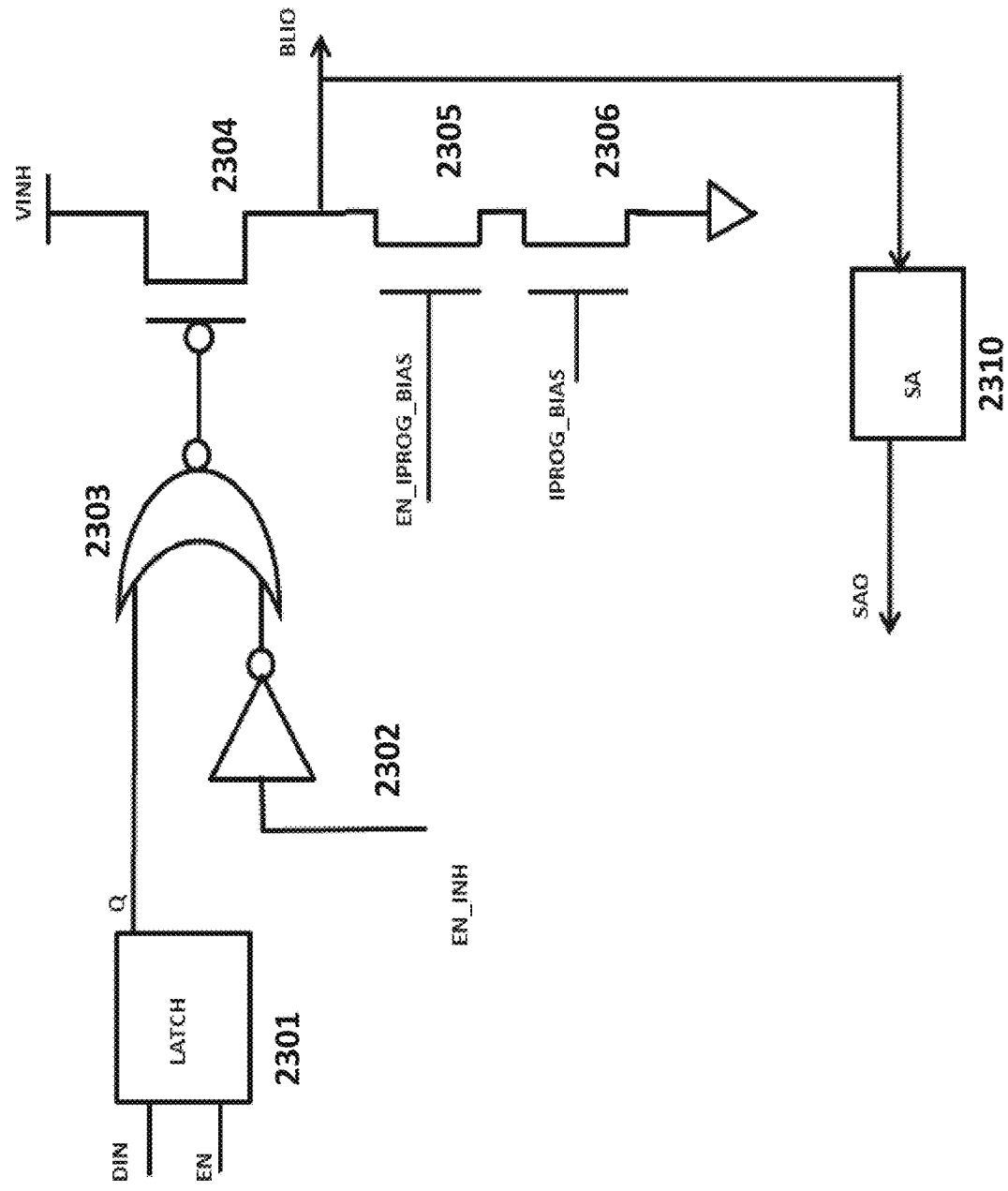
FIG. 23 depicts a column driver.

FIG. 23 depicts exemplary column driver 2300, which can be used as column driver 2203 in FIG. 22. Column driver 2300 comprises latch 2301, inverter 2302, NOR gate 2303, PMOS transistor 2304, and NMOS transistors 2305 and 2306, configured as shown. Latch 2301 received data signal DIN and enable signal EN. The node BLIO between PMOS transistor 2304 and NMOS transistor 2305 contains a bit line input or output signal, which is selectively connected to a bit line through a column decoder such as the column decoders 2202 in FIG. 22. Sense amplifier SA 2310 coupled to the bitline through the node BLIO to read cell current of selected memory cell. The sense amplifier SA 2310 is used to verify desired current level of the selected memory cell, such as after erase or program operation. The PMOS transistor 2304 serves to inhibit the bitline in programming depending on inhibit control circuit 2301/2302/2303. The NMOS transistor 2306 provides a bias program current to the bitline. The NMOS transistor 2305 enables the bias program current to the bitline, hence enabling the programming of selected memory cell. Hence a program control signal (such as the signals 1902/1903 in FIG. 19, the signals 2003/2004 in FIG. 20, the signals 2103/2104 in FIG. 21) to the gate of the NMOS transistor 2305 would enable program of selected cell.

FIG. 24 depicts exemplary VMM system 2400, which comprises references array matrices 2401a, 2401b, 2401c, and 2401d and VMM matrices 2402a, 2402b, 2402c, and 2402d. Each VMM matrix has its own reference array matrix.

FIG. 25 depicts exemplary VMM system 2500, which comprises a single reference array matric 2501 and VMM matrices 2502a, 2502b, 2502c, and 2502d. The single reference array matric 2501 is shared across multiple VMM matrices.

Figure 26:
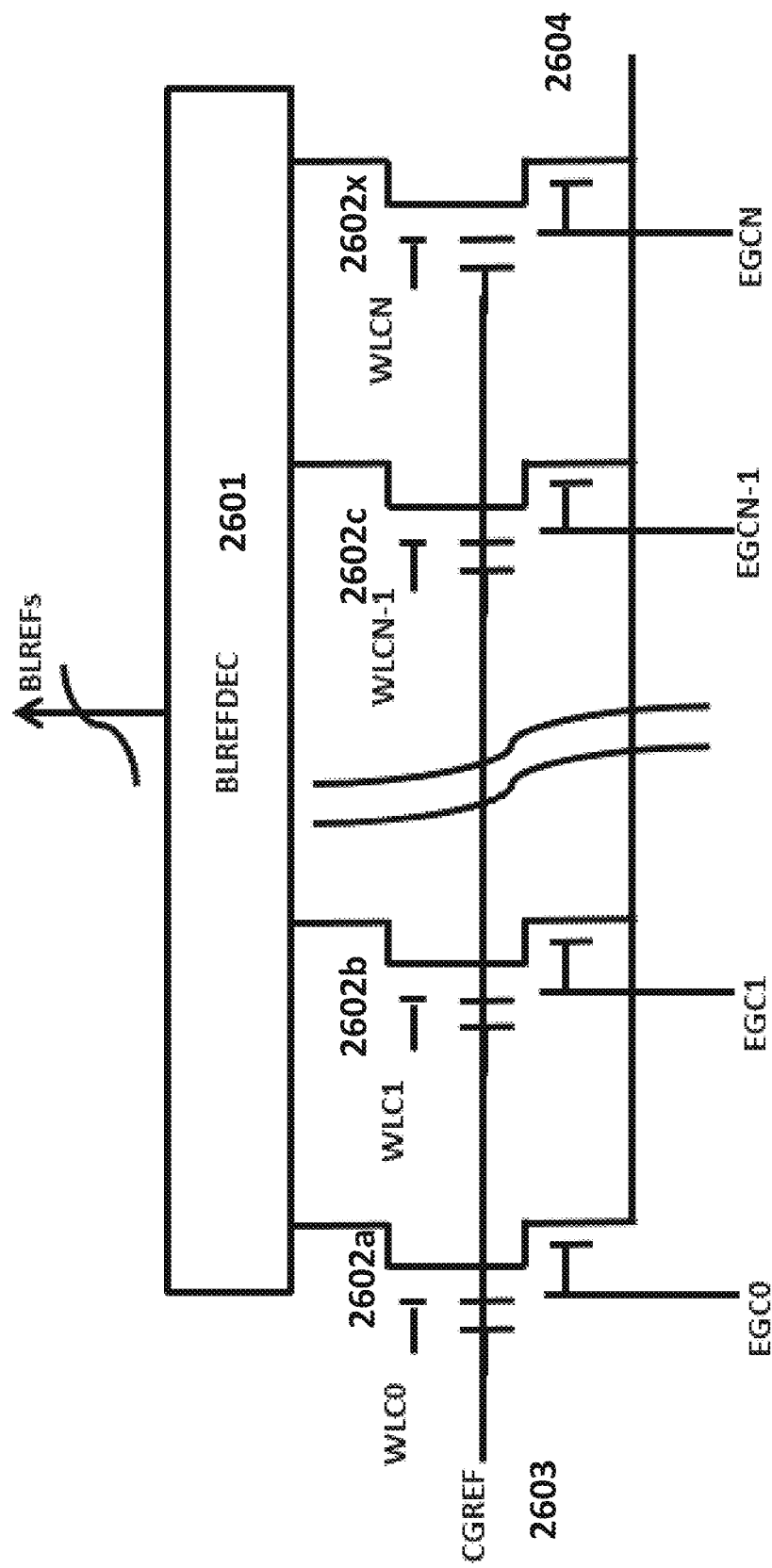
FIG. 26 depicts a reference matrix.
Figure 28:
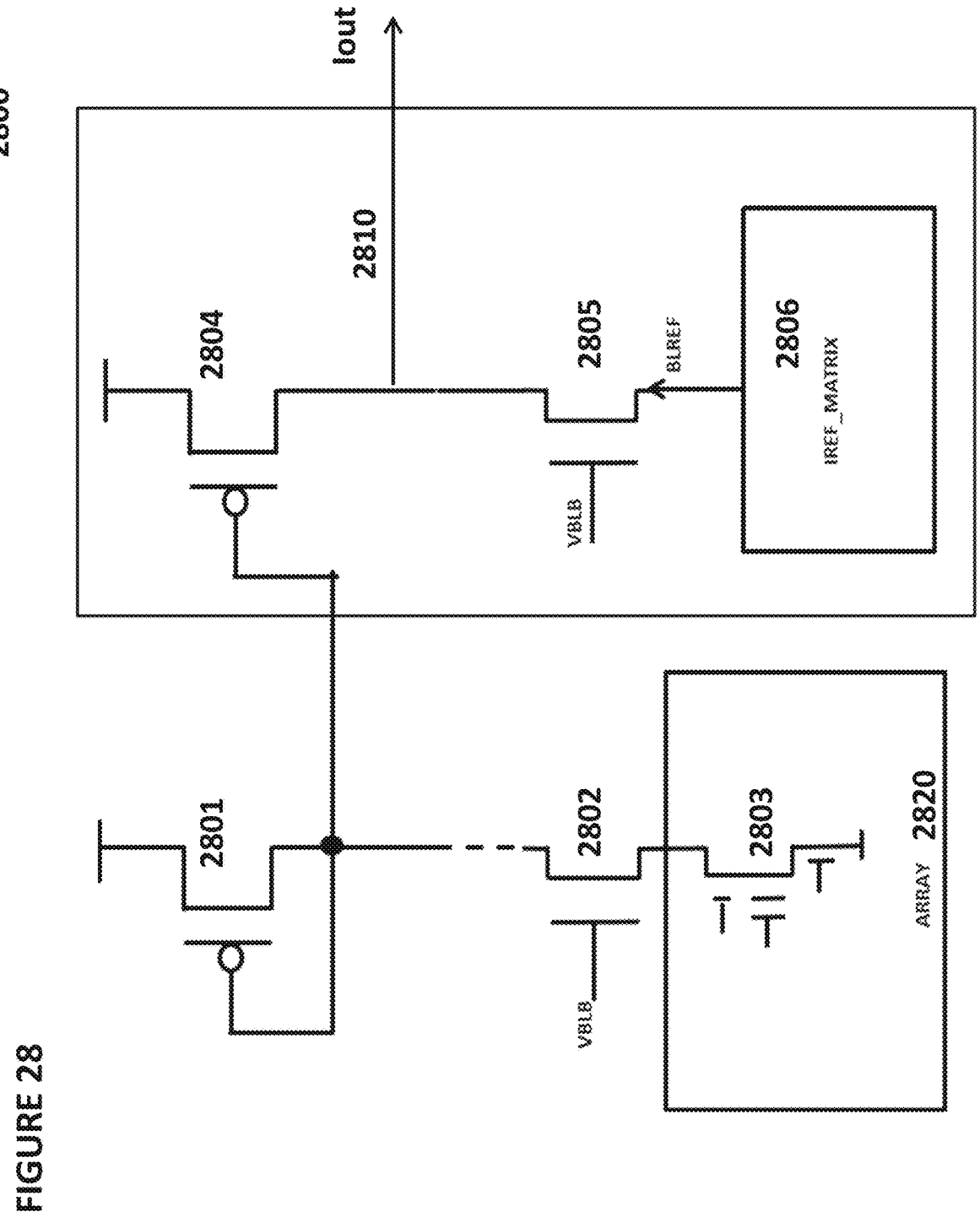
FIG. 28 depicts a comparison circuit.
Figure 29:
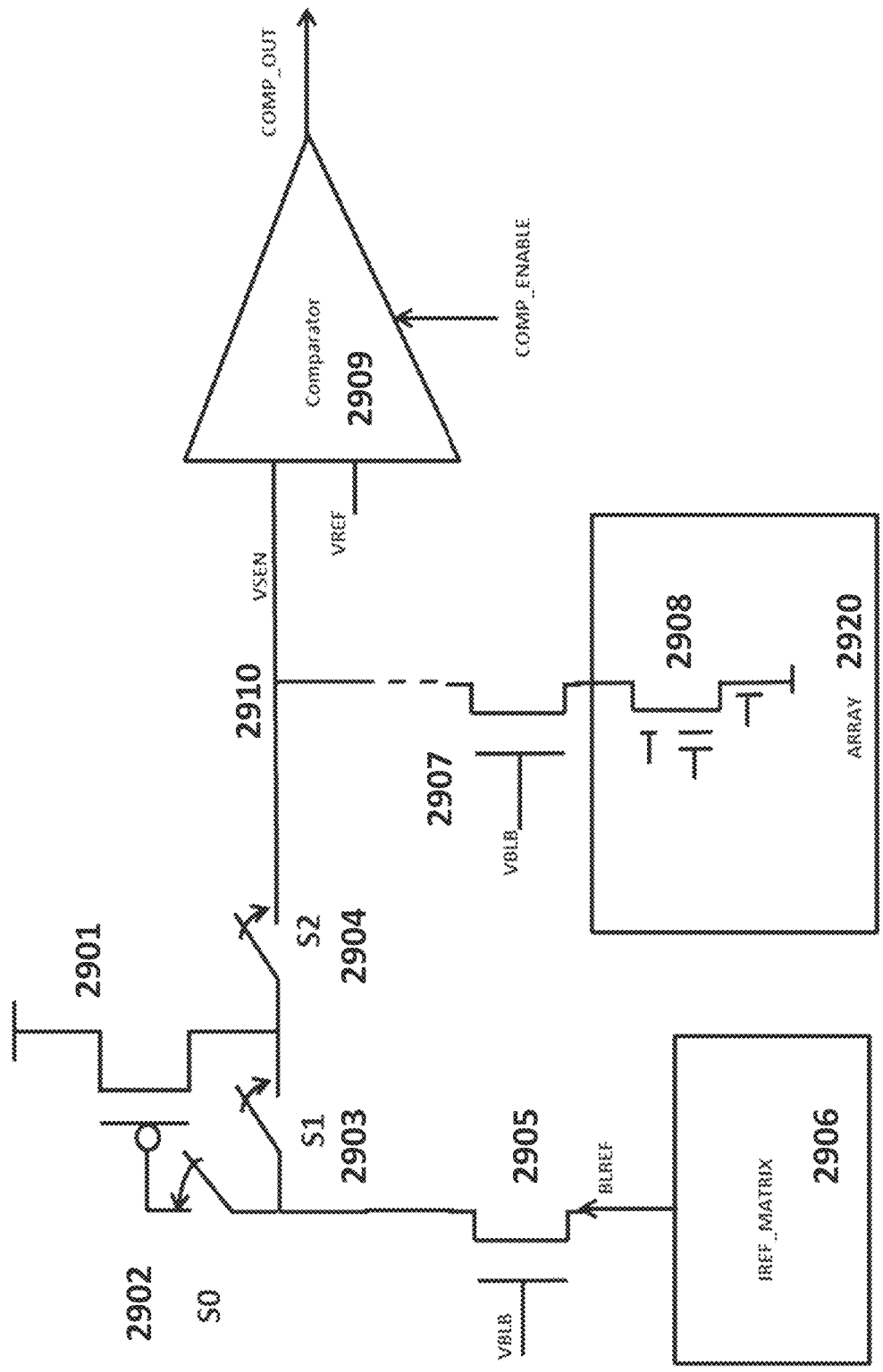
FIG. 29 depicts another comparison circuit.

FIG. 26 depicts exemplary reference matrix 2600, which can be used as reference matrices 2401a-d in FIG. 24, matrix 2501 in FIG. 25, or reference matrix 2801 or 2901 in FIGS. 28 and 29. Reference matrix 2600 comprises reference memory cells 2602a, 2602b, 2602c, and 2602x, coupled to common control gate signal 2603 and source line reference signal 2604, as well as bit line reference decoder 2601, which provides a plurality of bit line reference signals for use in read or verify operations. For example the reference memory cells 2602a-x can provides increment current level of 100 pA/200 pA/300 pA/ . . . /30 nA. Or the reference memory cells 2602a-x can provide constant current level of 100 pA for each reference memory cell. For this case, combination of reference memory cells 2602a-x is used to generate different reference current level, such as in a thermometer code fashion to generate 100 pA/200 pA/300 pA/etc. Other combination of reference current levels, constant and/or increment, can be used to generate a desired reference current level. Furthermore, a difference current between two reference cells can be used to generate a reference memory cell current such as 100 pA reference current=250 pA reference current−150 pA reference current. This is used for example to generate a reference current that is compensated over temperature.

Figure 27:
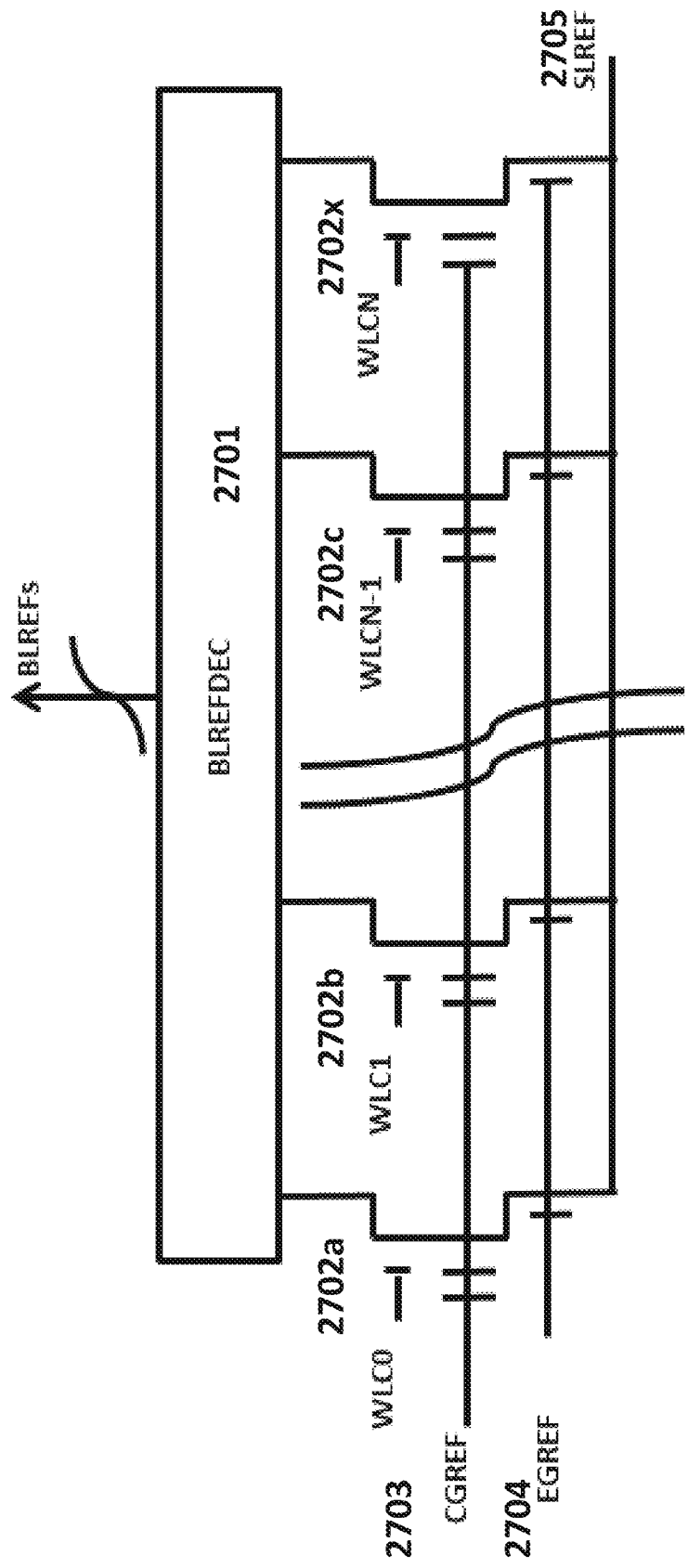
FIG. 27 depicts another reference matrix.

FIG. 27 depicts exemplary reference matrix 2700, which can be used as reference matrices 2401a-d in FIG. 24, matrix 2501 in FIG. 25, or reference matrix 2801 or 2901 in FIGS. 28 and 29. Reference matrix 2700 comprises reference memory cells 2702a, 2702b, 2702c, and 2702x, coupled to common control gate reference signal 2703, erase gate reference signal 2704, and source line reference signal 2705, as well as bit line reference decoder 2701, which provides a plurality of bit line reference signals for use in read or verify operations. Combination of reference current levels, constant and/or increment, can be used as in FIG. 26 to generate a desired reference current level.

FIG. 28 depicts Icell PMOS comparison circuit 2800, which comprises PMOS transistors 2801 and 2804, NMOS cascoding transistors 2802 and 2805, selected memory cell 2803 from a VMM memory array 2820, and reference matrix 2806 (such as reference matrix 2500 or 2600) arranged as shown. NMOS transistors 2802 and 2805 are used to bias reference bitlines to a desired voltage level. The output current, Tout, is a current value indicative of the value stored in selected memory cell 2803. The voltage level of output node 2810 indicates a comparison result between current in the selected memory cell 2803 versus a reference current from the reference matrix 28006. The voltage on the node 2801 rises to Vdd (or falls to ground) if the current in the selected memory cell 2803 is more than (or less than) a reference current from the reference matrix 2806.

FIG. 29 depicts Icell PMOS comparison circuit 2900, which comprises PMOS transistor 2901, switches 2902, 2903, and 2904, NMOS cascoding transistors 2905 and 2907, selected memory cell 2908 from a WM memory array 2920, reference matrix 2906 (such as reference matrix 2600 or 2700), and comparator 2909, arranged as shown. The output, COMP_OUT, is a voltage value indicative of the value stored in selected memory cell 2908 versus a reference current. The Icell comparison circuits work by using as single PMOS current mirror with time multiplexed to eliminate mismatch between two mirror PMOS transistor. For a first time period, S0 and S1 are closed and S2 is open. The current from the reference memory matrix 2906 is stored (held) in the PMOS transistor 2901. For the next time period, S0 and S1 are open and S2 is closed. The stored reference current is compared against the current from the memory cell 2908 and the comparison result is indicated on output node 2910. Optionally, the comparator can compare the voltage on the node 2901 against a reference voltage VREF to indicate the result of the comparison. Here, the reference current is sampled and held, and the current from the selected memory cell 2902 is sampled and held in the PMOS transistor 2901 to compare versus the reference current.

Figure 30:
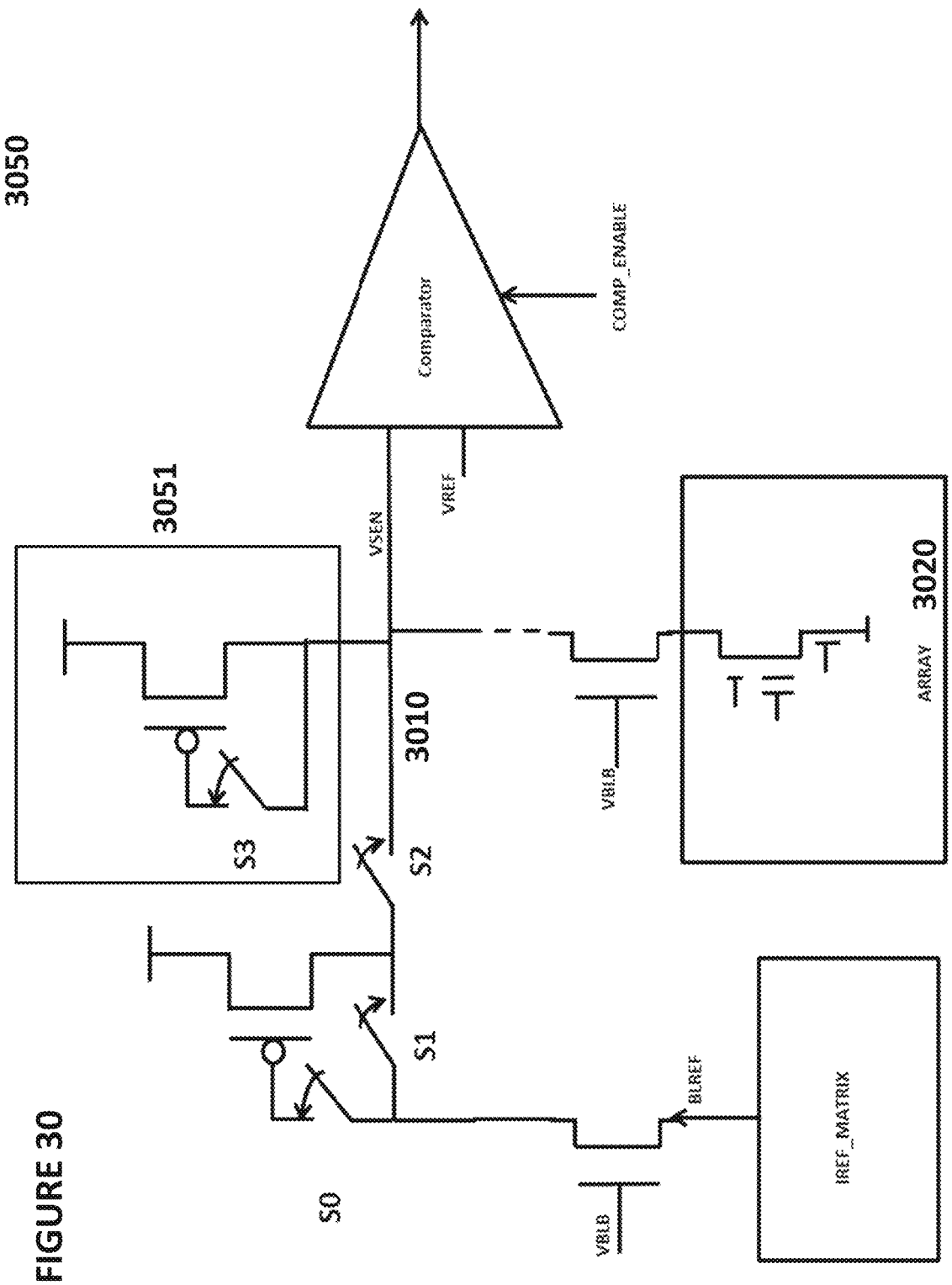
FIG. 30 depicts another comparison circuit.

In another embodiment, an array leakage compensation circuit 3051 as shown in FIG. 30 can be used with the single PMOS mirror circuit to sample (S3 closed) the leakage on the WM array 3020 (all wordlines are off, leakage current on bitline is sampled into the hold PMOS) and hold (S3 open) the leakage in a hold transistor. This leakage is then subtracted from the current in the selected memory cell in the comparison period to get the actual memory cell current from the VMM array 3020 for comparison. This can be used for all comparison circuits described herein. This can be used for reference array leakage compensation.

Figure 31:
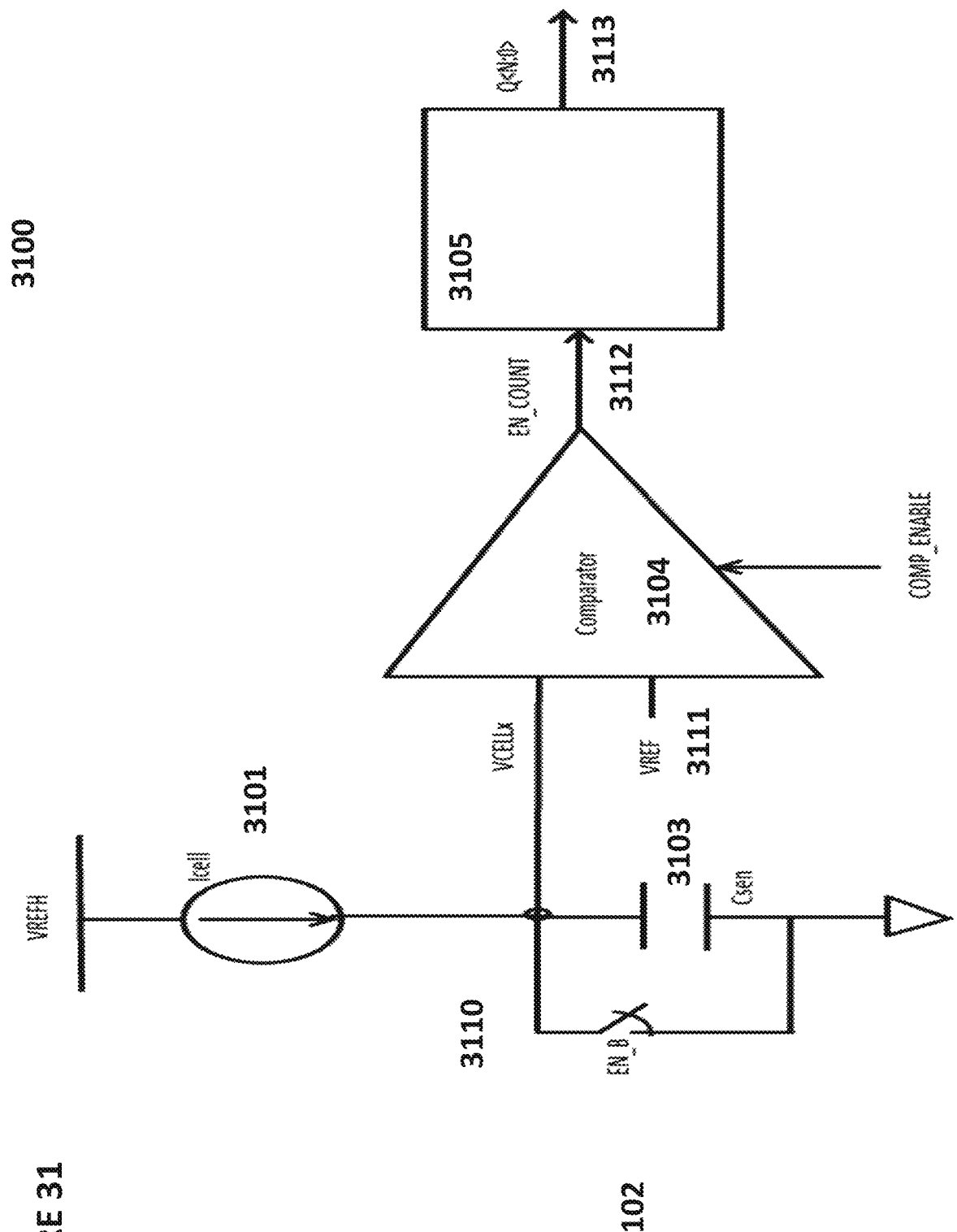
FIG. 31 depicts a current-to-digital bits circuit.

FIG. 31 depicts Icell-to-digital data circuit 3100, which comprises current source 3101, switch 3102, capacitor 3103, comparator 3104, and counter 3105. At the start of the comparison period, signal 3110 is pulled to ground. The signal 3110 then starts to rise depending on the cell current 3101 (extracted from a VMM memory array with array leakage compensation as described above). Ramping rate is proportional to cell current 3101 and capacitor 3103. Output 3112 of the comparator 3104 then enables the counter 3105 to start counting digitally. Once the voltage on the node 3110 reaches voltage level VREF 3111, the comparator 3104 switches polarity and stop the counter 3105. The digital output Q<N:0> 3113 value indicates the value of the cell current 3101.

Figure 32:
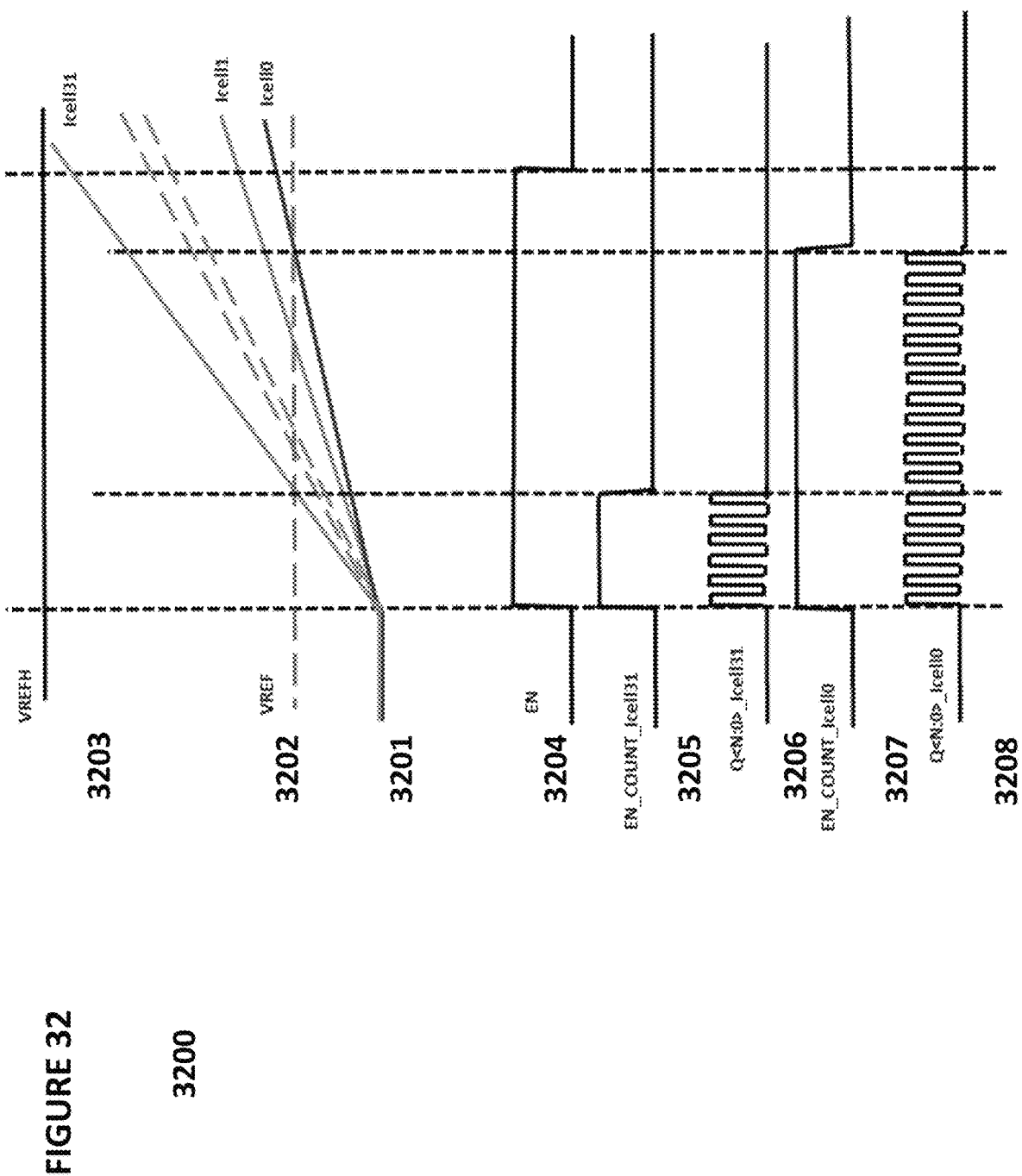
FIG. 32 depicts waveforms for the circuit of FIG. 31.

FIG. 32 depicts waveform 3200 for the operation of Icell-to-digital data circuit 3100. Signal 3201 is ramping voltage (corresponding to the signal 3110 in FIG. 31). Different ramp rates for the signal 3201 are shown for different cell current levels. Signals 3205 and 3207 are outputs of comparators (corresponding to the signal 3121 in FIG. 31) for two different cell currents. Signals 3206 and 3208 are digital outputs Q<N:0> for the above two different cell currents.

Figure 33:
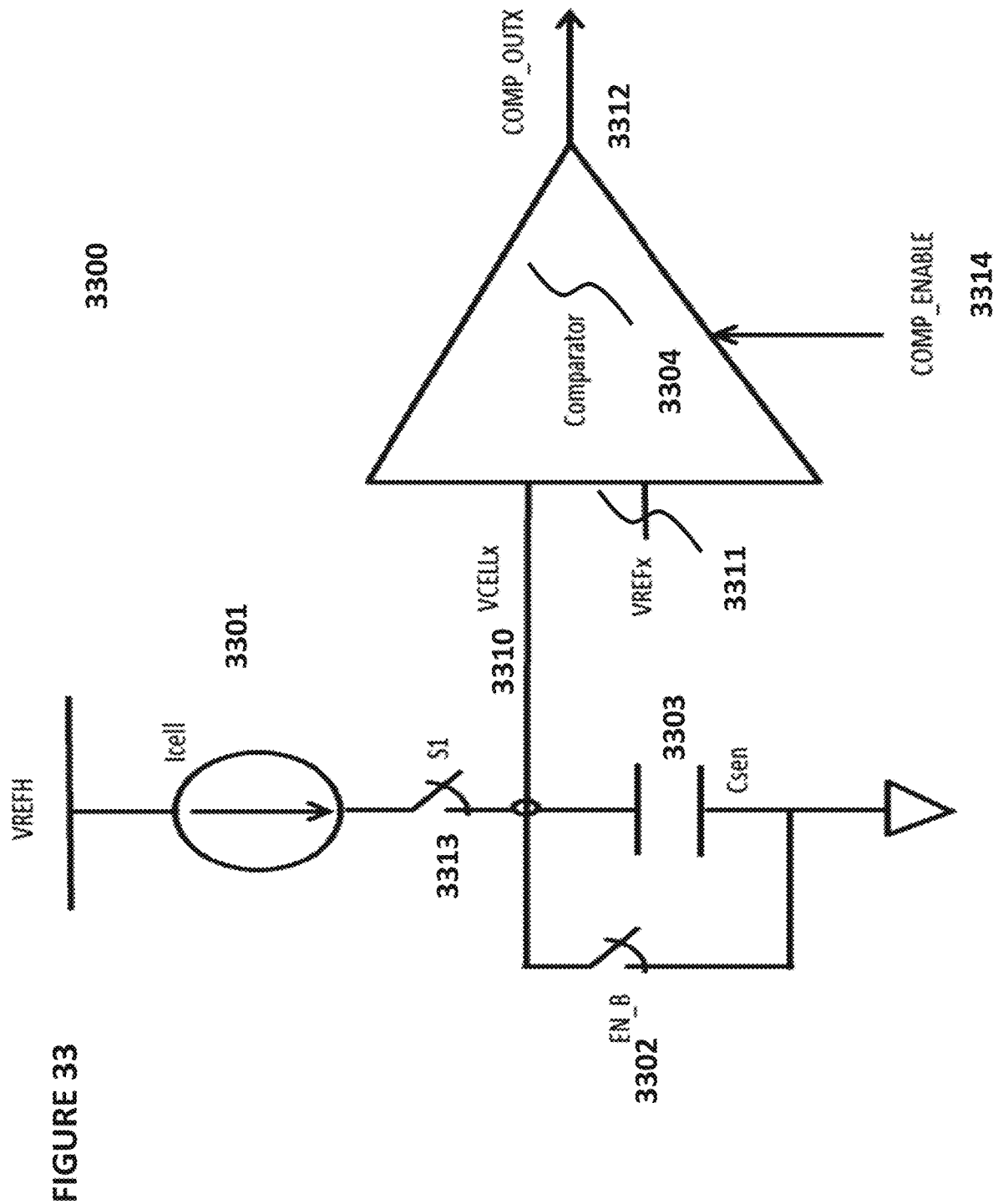
FIG. 33 depicts a current-to-slope circuit.

FIG. 33 depicts Icell-to-slop circuit 3300, which comprises memory cell current source 3301, switch 3302, capacitor 3303, and comparator 3304. The memory cell current is extracted from a VMM memory array with array leakage compensation as described above. At the start of the comparison period, signal 3310 is pulled to ground. The signal 3310 then starts to rise depending on the cell current 3301 (extracted from a VMM memory array). The ramping rate is proportional to cell current 3301 and capacitor 3303. After a fixed comparison period, the voltage on node 3310 is compared by the comparator 3304 against reference voltage VREFx 3311. The VREFx 3311 is, for example, 0.1V, 0.2V, 0.3V, . . . , 1.5V, 1.6V for 16 reference levels. Each level hence corresponds to a current level for 16 different current levels. Output of the comparator 3304 indicates value of the cell current 3301. To compare the voltage on the node 3310 (which can be held on the capacitor 3303 by shutting off S1 after the fixed comparison period) against 16 reference levels, either 16 comparators with 16 reference levels are used or one comparator with reference level multiplexed 16 times for 16 reference levels.

Figure 34:
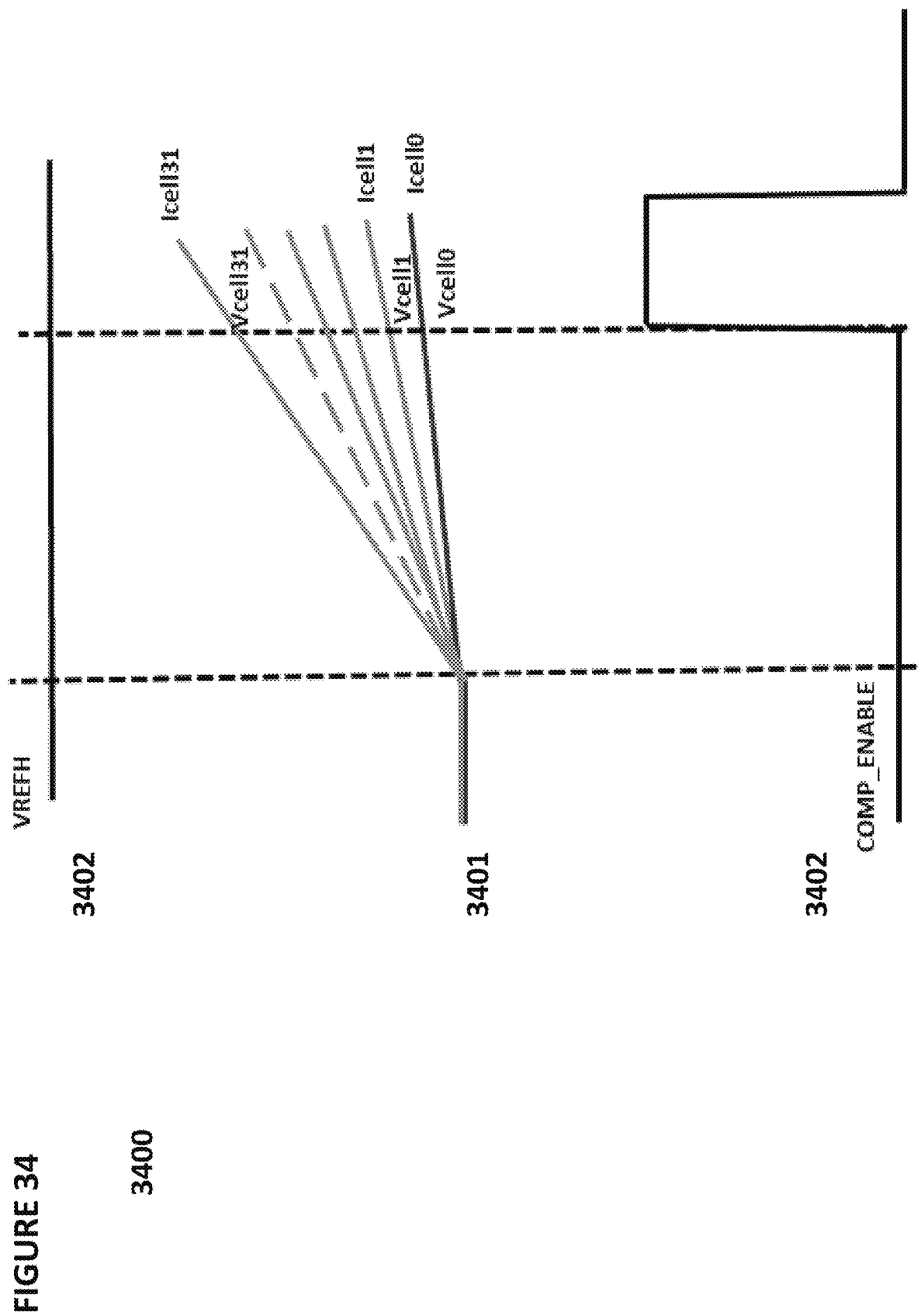
FIG. 34 depicts waveforms for the circuit of FIG. 33.

FIG. 34 depicts waveforms 3400 for the operation of Icell-to-slope circuit 3300. Signal 3401 shows different ramp rates with different voltage levels (Vcellx) at the rising edge of enabling signal 3402. The voltage Vcellx is compared against the reference voltages to indicate the value of the cell current (the reference voltage VREFx 3311 in FIG. 33).

Figure 35:
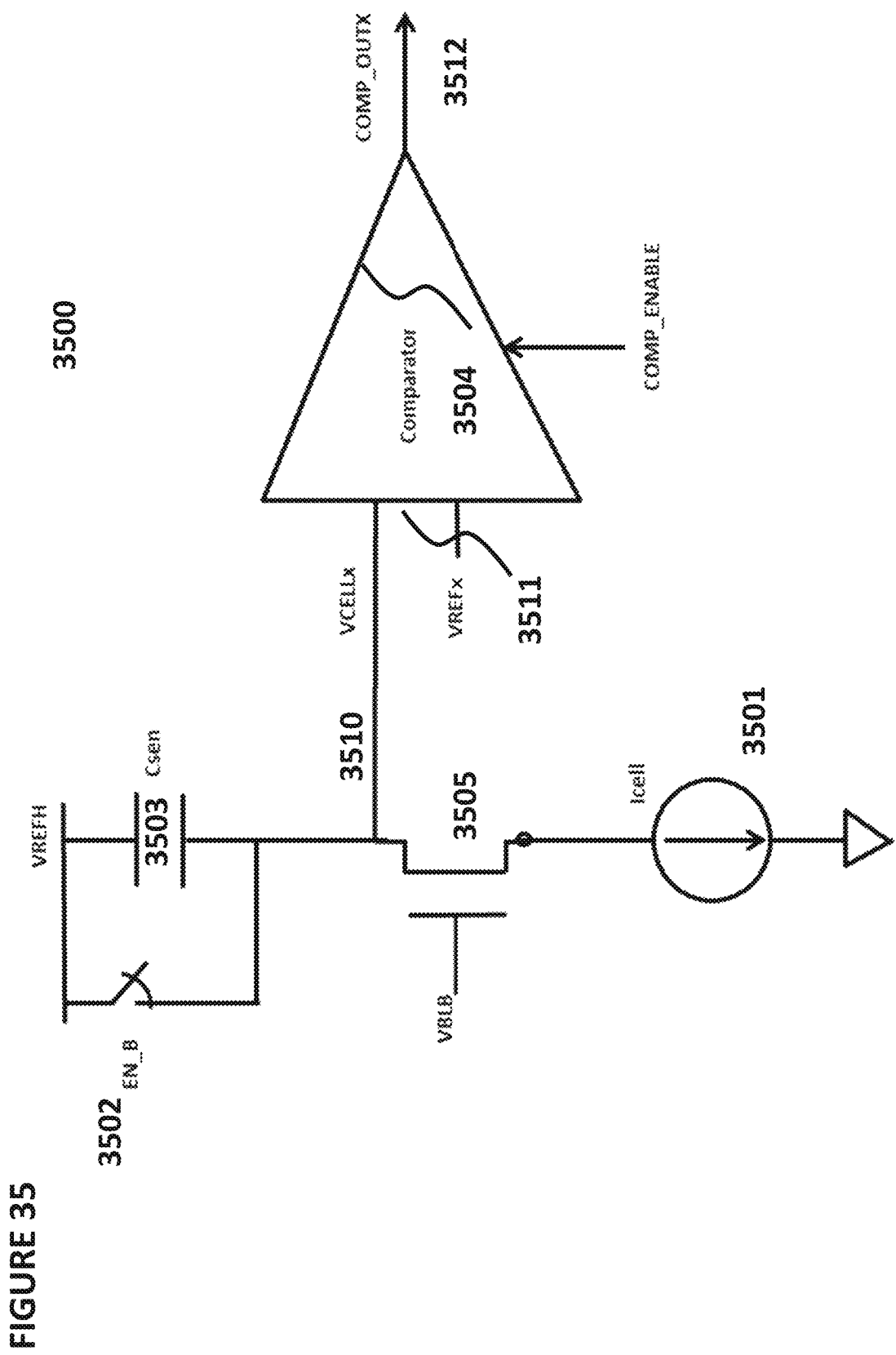
FIG. 35 depicts a current-to-slope circuit.

FIG. 35 depicts Icell-to-slope conversion circuit 3500, which comprises memory cell current source 3504, switch 3502, capacitor 3501, NMOS cascoding transistor 3503, and comparator 3505. The memory cell current 3501 is extracted from a VMM memory array with array leakage compensation as described above. The NMOS 3503 is used to bias a voltage on bitline of a selected memory cell (shown as Icell 3504). The operation is similar to that of FIG. 31 except the ramp direction is ramping down instead of ramping up.

Figure 36:
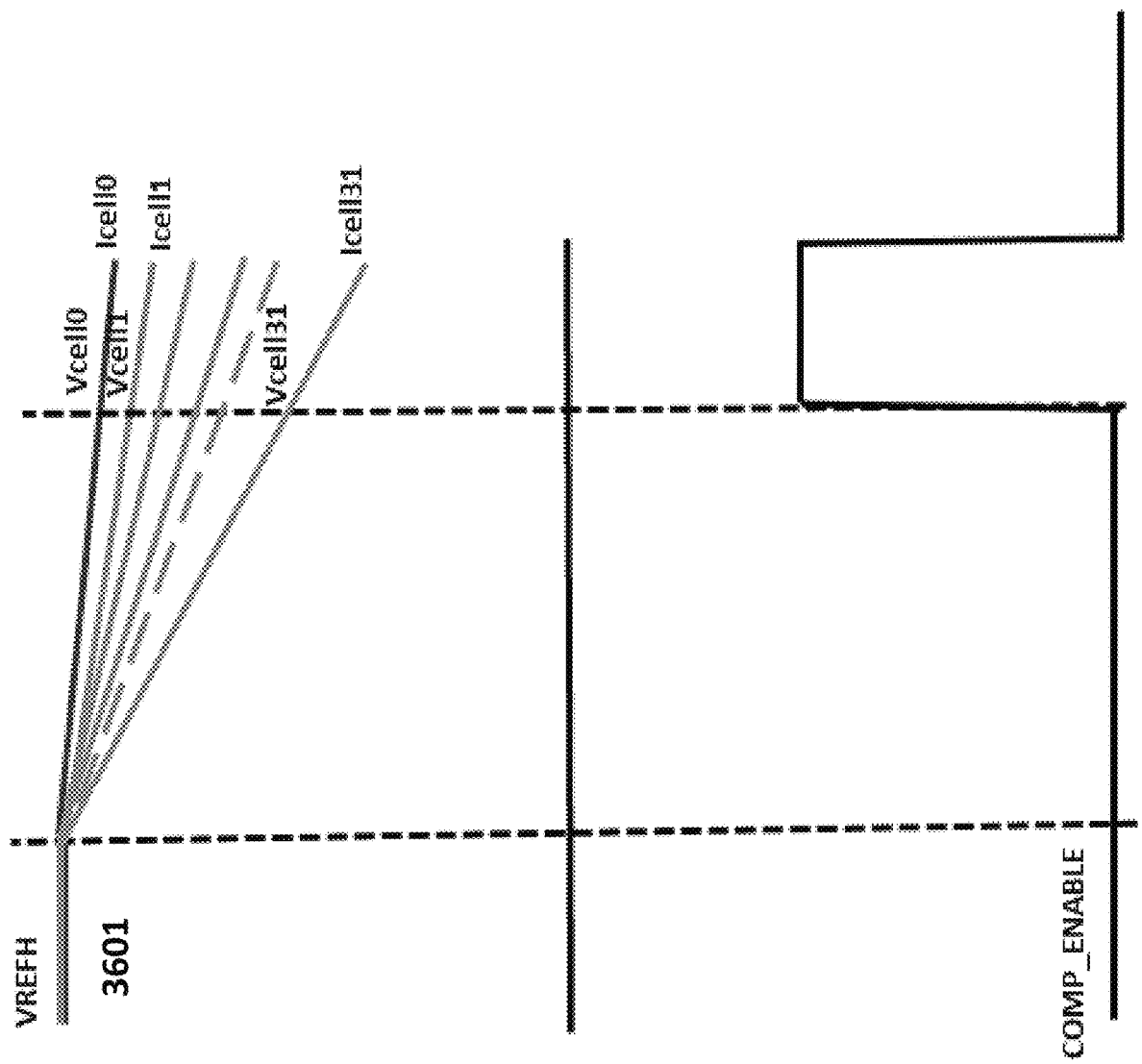
FIG. 36 depicts waveforms for the circuit of FIG. 35.

FIG. 36 depicts waveforms 3600 for the operation of Icell-to-slope circuit 3500.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A circuit for determining a value stored in a memory cell during a read or verify operation, the circuit comprising:
   a memory cell outputting a current at an input node;
   a switch coupled to the input node for pulling the input node to ground prior to the read or verify operation;
   a capacitor coupled to the memory cell at the input node; and
   a comparator with a first input coupled to the input node and a second input coupled to one of a plurality of voltage references, wherein an output of the comparator indicates the value stored in the memory cell.

2. The circuit of claim 1, wherein the memory cell current is held on a transistor.

3. The circuit of claim 1, further comprising an array leakage compensation circuit.

4. The circuit of claim 1, wherein the memory cell is a split gate memory cell.

5. The circuit of claim 1, wherein the memory cell is a stacked gate memory cell.

6. The circuit of claim 1, wherein the plurality of voltage references are time-multiplexed to the second input.

7. A circuit for determining a value stored in a memory cell during a read or verify operation, the circuit comprising:
   a memory cell drawing a current from an input node;
   a transistor comprising a first terminal and a second terminal, the second terminal coupled to the input node;
   a capacitor coupled between a voltage source and the first terminal of the transistor;
   a switch coupled to the first terminal of the transistor for pulling the first terminal of the transistor to a voltage of the voltage source prior to the read or verify operation; and
   a comparator with a first input coupled to the first terminal of the transistor and a second input coupled to one of a plurality of voltage references, wherein an output of the comparator indicates the value stored in the memory cell.

8. The circuit of claim 7, wherein the memory cell current is held on a transistor.

9. The circuit of claim 7, further comprises an array leakage compensation circuit.

10. The circuit of claim 7, wherein the memory cell is a split gate memory cell.

11. The circuit of claim 7, wherein the memory cell is a stacked gate memory cell.

12. The circuit of claim 7, wherein the plurality of voltage references are time-multiplexed to the second input.

* * * * *